United States Patent
Ikehashi

(10) Patent No.: US 7,466,060 B2
(45) Date of Patent: Dec. 16, 2008

(54) PIEZOELECTRIC DRIVING TYPE MEMS APPARATUS

(75) Inventor: Tamio Ikehashi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 523 days.

(21) Appl. No.: 11/100,472

(22) Filed: Apr. 7, 2005

(65) Prior Publication Data

US 2006/0119227 A1    Jun. 8, 2006

(30) Foreign Application Priority Data

Dec. 8, 2004   (JP)   ............................ 2004-355240

(51) Int. Cl.
*H01L 41/08* (2006.01)

(52) U.S. Cl. .................................... 310/309

(58) Field of Classification Search .................. 310/328, 310/332, 330, 366–365, 348, 309; 361/277; 359/223–226, 843; *H01L 41/08*
See application file for complete search history.

(56) References Cited

U.S. PATENT DOCUMENTS 6,217,159 B1 *  4/2001  Morikoshi et al. ............ 347/71
6,700,307 B2 *  3/2004  Kitahara ..................... 310/328

FOREIGN PATENT DOCUMENTS

| JP | 8-187848 | 7/1996 |
| JP | 10-209519 | 8/1998 |

* cited by examiner

*Primary Examiner*—Darren Schuberg
*Assistant Examiner*—Karen B Addison
(74) *Attorney, Agent, or Firm*—Oblon, Spivak, McClelland, Maier & Neustadt, P.C.

(57) ABSTRACT

A piezoelectric driving type MEMS apparatus includes: a supporting portion provided on a substrate; and a piezoelectric actuator, which is supported on the supporting portion, including a piezoelectric film and a driving electrode configured to drive the piezoelectric film, the piezoelectric film in the piezoelectric actuator having at least one slit extending along a longitudinal direction of the piezoelectric actuator.

15 Claims, 27 Drawing Sheets

SECTION A-A

SECTION B-B

SECTION A-A

SECTION A-A

SECTION B-B

SECTION A-A

SECTION B-B

SECTION A-A

SECTION B-B

SECTION A-A

SECTION B-B

SECTION A-A

SECTION B-B

SECTION A-A

SECTION B-B

SECTION A-A

SCTION B-B

PIEZOELECTRIC DRIVING TYPE MEMS APPARATUS

CROSS-REFERENCE TO RELATED APPLICATION

This application is based upon and claims the benefit of priority from prior Japanese Patent Application No. 2004-355240 filed on Dec. 8, 2004, the entire contents of which are incorporated herein by reference.

BACKGROUND OF THE INVENTION

1. Field of the Invention

The present invention relates to a piezoelectric driving type MEMS apparatus that is manufactured utilizing a MEMS (Micro-Electro-Mechanical Systems) technique.

2. Related Art

In recent years, attention is paid to a technique for manufacturing such a high frequency element as a variable capacitor or a switch utilizing a MEMS. A variable capacitor obtained by the MEMS has such an advantage that a Q value thereof is higher than that of a variable capacitance diode. On the other hand, the MEMS switch has such merits that an insertion loss thereof is low and isolation property thereof is excellent compared to PIN diode and GaAsFET based-switch (for example, see U.S. Pat. No. 4,670,682). The merits come from a feature of the MEMS that can manufacture a mechanically movable portion.

In order to manufacture the mechanically movable portion, it is necessary to provide an actuator for converting an electrical signal to a mechanical behavior. Actuators can be classified to some types according to their driving systems. As well-known driving systems, there are ones of an electrostatic type, a thermal type, an electromagnetic type and a piezoelectric type. The piezoelectric type driving system is constituted to realize a movable structure utilizing a piezoelectric effect of piezoelectric material. The piezoelectric type actuator has such an advantage that both a low voltage operation and a low power consumption can be realized. Therefore, an MEMS variable capacitor or a MEMS switch utilizing a piezoelectric type actuator is suitable for a high frequency part for a portable device or equipment.

A conventional MEMS variable capacitor employs such a structure that a lower electrode for the variable capacitor is provided at a central portion of a substrate, supporting portions are provided at both ends of the substrate, and a beam which is supported by the supporting portions to displace toward the substrate is provided. The beam is provided with a first insulating film, a first electrode film that is provided on the first insulating film to extend from one end of the beam to the other end thereof, piezoelectric films which are provided on both end portions of the first electrode film except for a central portion thereof, second electrode films which are provided on the piezoelectric films, and a second insulating film which covers the first and second electrode films. As material for the piezoelectric film, PZT, AlN, ZnO, or the like is used. Incidentally, the first electrode film serves as an upper electrode for the variable capacitor.

When different voltages, V1 and V2, are respectively applied to the first electrode film and the second electrode film the piezoelectric films strain so that the length of the beam in its extending direction (hereinafter, "X-axis direction") varies. When it is assumed that a length $L_x$ of the piezoelectric film in the X-axis direction has changed to $L_x + \Delta L_x$ due to voltage application, a strain $\epsilon_x = \Delta L_x / L_x$ can be expressed by the following equation (1).

$$\epsilon_x = d_{31}(V1-V2)/t \tag{1}$$

Here, t represents a thickness of a piezoelectric film, and $d_{31}$ represents a piezoelectric constant. The piezoelectric constant $d_{31}$ is a parameter which represents amounts of strain occurring in the X-axis direction and in a direction (hereinafter, "Y-axis direction) orthogonal to the X and Z axes and a film thickness direction of the piezoelectric film (hereinafter, "Z-axis direction") when electric field is applied in the Z-axis direction, whose value varies according to piezoelectric material. The beam including the piezoelectric films flexes in the direction of the substrate due to strain in the piezoelectric film so that a distance between the first electrode (film) and the lower electrode changes. A change $\delta_z$ of the distance between the electrodes meets the following relationship or equation (2).

$$\delta_z \propto d_{31}(V1-V2)L_x^2 \tag{2}$$

Accordingly, according to increase of a length of the piezoelectric film in the X-axis direction, namely, a length of the beam, a variable range of the capacitor is increased.

Since a cavity is formed under the upper electrode in an MEMS variable capacitor with such a structure, there is such a drawback that, when an acceleration is applied to the MEMS variable capacitor, the upper electrode may move, which results in change in capacitance value. In order to make it harder for the upper electrode to move even when acceleration is applied to the MEMS variable capacitor, such a constitution can be employed that the beam and the upper electrode are reduced in weight and a width $L_y$ of the beam which supports the upper electrode is increased. When the MEMS variable capacitor is mounted to a portable device, there is a high possibility that the portable device is used under an environment where acceleration is applied to the portable device. Therefore, such a countermeasure as widening of the beam becomes important among others.

However, when the width $L_y$ of the beams is increased, the piezoelectric film also strains in the Y-axis direction at a time of application of voltage to the first and second electrodes. A strain $\epsilon_y (= \Delta L_y / L_y)$ in the Y-axis direction can be expressed as follows:

$$\epsilon_y = d_{32}(V1-V2)/t \tag{3}$$

Here, $d_{32}$ represents a piezoelectric constant. The beam flexes in the Y-axis direction toward the substrate due to the strain. As a result, such a problem occurs that the upper electrode and the lower electrode do not become parallel to each other so that a desired capacitance value can not be obtained. Incidentally, a displacement amount due to flexion, namely, $\delta_y$, is proportional to square of the beam width $L_y$.

The flexion of the beam also causes a problem in a piezoelectric type MEMS switch. In order to prevent the isolation property during turning-off of the MEMS switch from depending on acceleration, it is necessary to increase the width of the beam in the MEMS switch. As a result, however, the flexion of the beam also occurs in the Y-axis direction during voltage application. Therefore, when the switch turns on, the electrodes at a contact portion do not become parallel to each other, and they come in contact with each other at only one point. As a result, a resistance occurring when the switch turns on increases and an insertion loss increases so that a desired property can not be obtained. Further, the increase in resistance tends to cause malfunction in the switch due to melting of the electrodes at the contacting portion.

SUMMARY OF THE INVENTION

A piezoelectric driving type MEMS apparatus according to an aspect of the present invention includes: a supporting portion provided on a substrate; and a piezoelectric actuator, which is supported on the supporting portion, including a piezoelectric film and a driving electrode configured to drive the piezoelectric film, the piezoelectric film in the piezoelectric actuator having at least one slit extending along a longitudinal direction of the piezoelectric actuator.

DETAILED DESCRIPTION OF THE INVENTION

Embodiments of the present invention will be explained below with reference to the drawings.

First Embodiment

Figure 1:
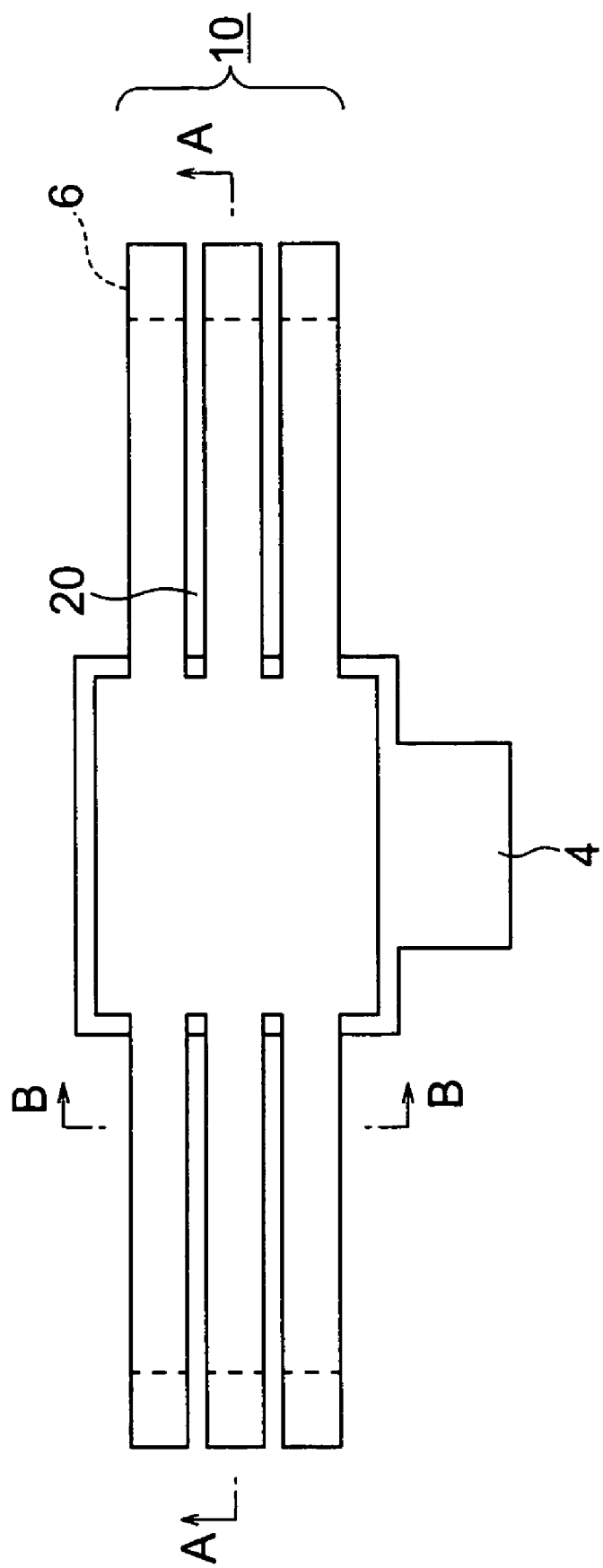
FIG. 1 is a plan view showing a piezoelectric driving type MEMS apparatus according to a first embodiment of the present invention.
Figure 2:
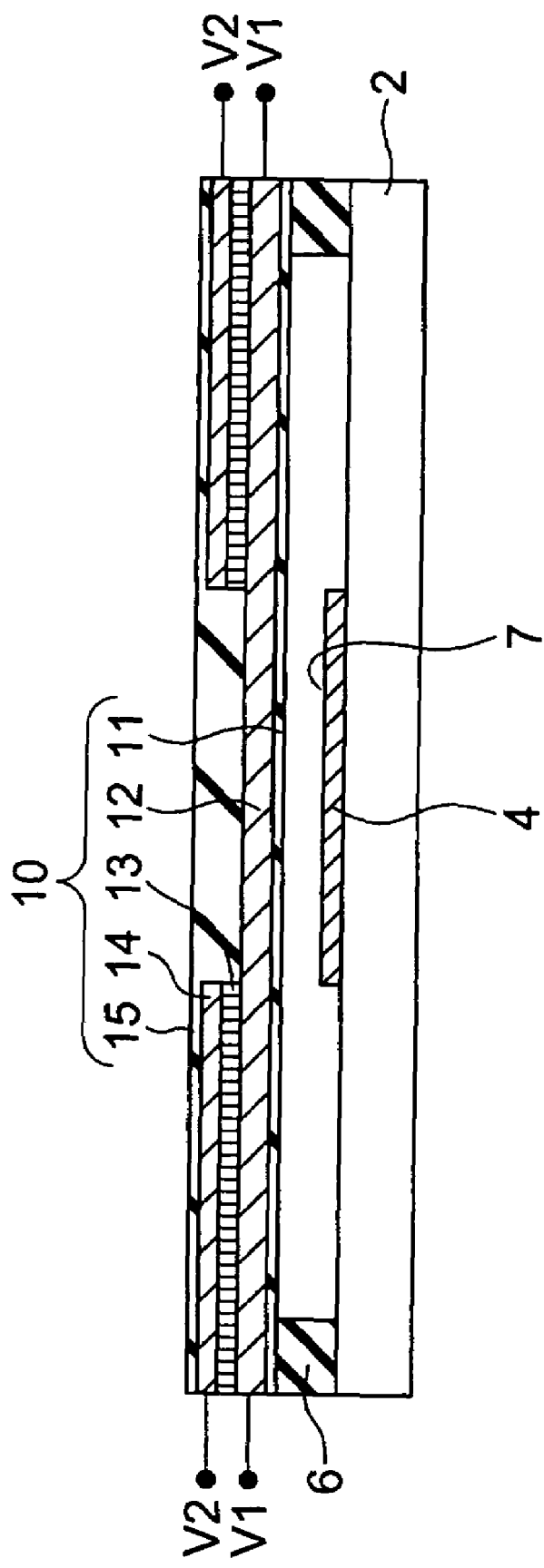
FIG. 2 is a sectional view showing the piezoelectric driving type MEMS apparatus taken along line A-A shown in FIG. 1.
Figure 3:
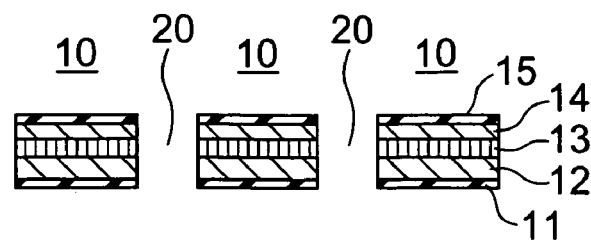
FIG. 3 is a sectional view showing the piezoelectric driving type MEMS apparatus taken along line B-B shown in FIG. 1.

A piezoelectric driving type MEMS apparatus according to a first embodiment of the invention will be explained with reference to FIGS. 1 to 3. FIG. 1 is a plan view of the piezoelectric driving type MEMS apparatus according to the embodiment, FIG. 2 is a sectional view of the piezoelectric driving type MEMS apparatus according to the embodiment taken along line A-A shown in FIG. 1, and FIG. 3 is a sectional view of the piezoelectric driving type MEMS apparatus according to the embodiment taken along line B-B shown in FIG. 1.

The piezoelectric driving type MEMS apparatus according to the embodiment is a variable capacitor which has such a constitution that a lower electrode 4 is provided on a central portion of a substrate 2 made from silicon or glass, and a plurality of (for example, three) supporting portions 6 are provided at each of both end portions of the substrate 2 so as to be opposed to corresponding supporting portions 6 at the other end portion thereof. Further, the variable capacitor has a constitution that a beams 10 is spanned between the opposed supporting portions 6 over the lower electrode 4.

The beams 10 is provided with an insulating film 11 made from, for example, $SiO_2$, a first electrode 12 provided on the insulating film 11, a piezoelectric film 13 provided on a region of the first electrode 12 except for a central portion of the first electrode 12, a second electrode 14 provided on the piezoelectric film 13, and a protective film 15 provided so as to cover the second electrodes 14 and the central portion of the first electrode 12 and made from, for example, SiO$_2$. The beam 10 is formed such that a central portion thereof is wider than each end portions thereof (a vertical size or length in FIG. 1), and two slits 20 are provided at the end portion so as to extend along a longitudinal direction of the beam 10 so that three branched beams are formed on the each end portion by the slits 20. Each slit 20 is formed such that a length thereof (a horizontal size or length in FIG. 1) is equal to or longer than that of each piezoelectric film 13. Incidentally, such a constitution is employed that the three branched beams are respectively supported by the supporting portions 6. Such a constitution is adopted that a height of each supporting portion 6 is larger than a film thickness of the lower electrode 4, so that a clearance 7 is formed between the lower electrode 4 and the beam 10 (see FIG. 2).

In the embodiment, when a driving voltage V1 and a driving voltage V2 are respectively applied to the first electrode 12 and the second electrode 14, the piezoelectric film 13 strains and a length thereof in its longitudinal direction (the horizontal direction in FIG. 1) changes so that the beam 10 flexes toward the lower electrode 4. A distance between the lower electrode 4 and the first electrode 12 changes due to the flexion so that a capacitance also changes. That is, the beam 10 constitutes a piezoelectric actuator. The first electrode 12 doubles with an upper electrode for the variable capacitor.

A magnitude relationship between the driving voltages V1 and V2 changes according to such a factor as the kind of the piezoelectric film, orientation of polarization, film thickness sizes of films positioned above and below the piezoelectric film, or Young's modulus. For example, a case that an AlN film whose orientation (FIG. 2) of polarization is directed upwardly is used as the piezoelectric film will be explained. A total film thickness of films positioned under the piezoelectric film, namely, the sum of film thicknesses of the insulating film 11 and the first electrode 12 is represented as t1, and a total film thickness of films positioned above the piezoelectric film, namely, the sum of film thicknesses of the second electrode 14 and the protective film 15 is represented as t2. For simplification, it is assumed that the insulating film 11, the first electrode 12, the second electrode 14, and the protective film 15 are equal in Young's modulus. Since $d_{31}$ of AlN is negative, under the condition of t2>t1, when the driving voltage V1 is larger than the driving voltage V2, the piezoelectric film shrinks so that the actuator moves downwardly and when the driving voltage V1 is smaller than the driving voltage V2, the piezoelectric film stretches so that the actuator moves upwardly. The actuator moves in directions reversed to the above directions under the condition of t2<t1. Even when PZT is adopted as the piezoelectric film, moving directions of the actuator are similar to those in the above case. However, it is desirable that PZT is used under such a voltage condition that polarization reversal does not occur. This is because the piezoelectric performance of the piezoelectric film degrades due to polarization fatigue caused by repetition of polarization reversal.

As explained above, in the embodiment, the branched beams are formed by providing the slits 20 on the both ends of the beam 10. Therefore, since a total sum of widths of the piezoelectric films 13 on the branched beams is smaller than a width of a piezoelectric film of a beam 10 which is not provided with the slits 20, it is made possible to reduce flexion of the piezoelectric film 13 due to strain in the widthwise direction. For example, when n branched beams are formed by providing (n−1) slits 20 on each of both ends of the beam 10 and a total sum of transverse widths of the n branched beams is set to be equal to a width of a beam where no slit is formed, a displacement amount δ due to strain of a piezoelectric film on one branched beam in a widthwise direction thereof can be reduced to $1/n^2$ that in the case that the slits 20 are not provided. Accordingly, as shown in FIG. 3, a section of the beam 10 takes an approximately flat shape without being deformed substantially. Thereby, the lower electrode 4 and the upper electrode 12 constituting the capacitor become substantially parallel to each other, so that a desired capacitance can be obtained.

When the total sum of the widths of the branched beams is set to be equal to the width of the beam where the slits are not provided, acceleration tolerance can be prevented from deteriorating.

Figure 4:
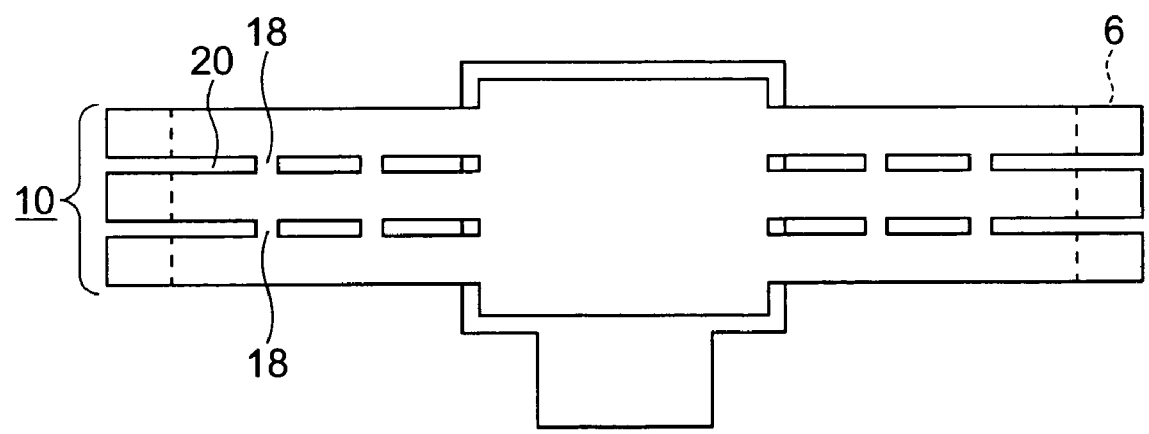
FIG. 4 is a plan view showing a piezoelectric driving type MEMS apparatus according to modification of the first embodiment of the present invention.

As shown in FIG. 4, the slits may be formed in such a manner that adjacent branched beams are connected to each other by a bridge portion(s) 18. In that case, each bridge portion 18 may be constituted of a dielectric or insulating film, a first electrode, a piezoelectric film, a second electrode, and a protective film. When the shape shown in FIG. 4 is employed, acceleration tolerance can be further improved.

By forming slit(s) in the piezoelectric actuator, the following advantages can be achieved. (1) By removing a sacrifice layer from the slit portion at a time of removal of a sacrifice layer from a lower portion of the actuator, an etching depth may be made shallow, so that an etching time can be reduced as compared with that in case that no slit is formed. (2) Since air passes through the slit(s) during operation of the actuator, a damping effect (squeezed film damping effect) due to air resistance can be suppressed, so that operation of the actuator at a higher speed can be made possible.

As explained above, according to the embodiment, a desired capacitance can be obtained even during application of acceleration.

Second Embodiment

Figure 5:
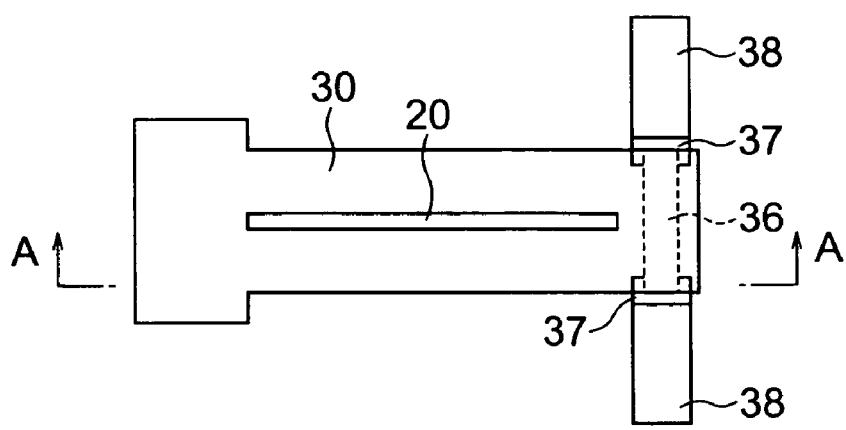
FIG. 5 is a plan view showing a piezoelectric driving type MEMS apparatus according to a second embodiment of the present invention.
Figure 6:
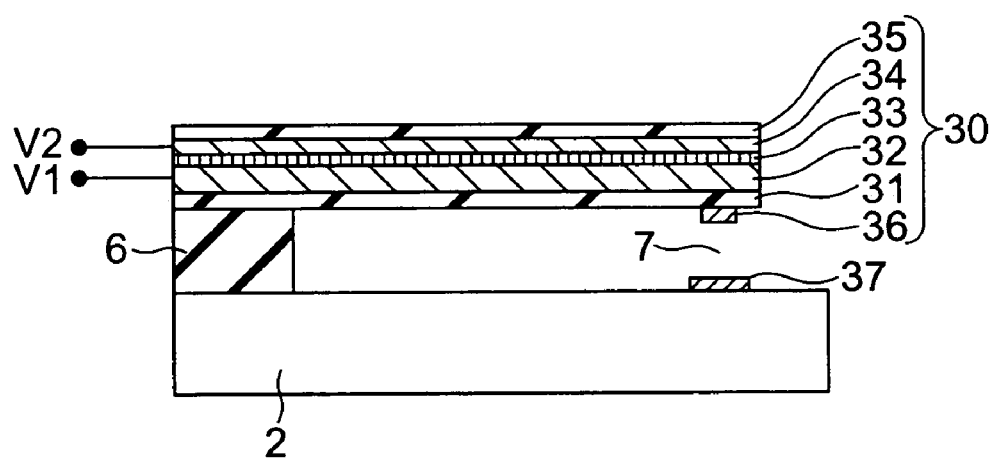
FIG. 6 is a sectional view showing the piezoelectric driving type MEMS apparatus taken along line A-A shown in FIG. 5.

Next, a piezoelectric driving type MEMS apparatus according to a second embodiment of the invention will be explained with reference to FIGS. 5 and 6. FIG. 5 is a plan view showing a constitution of a piezoelectric driving type MEMS apparatus according to the embodiment and FIG. 6 is a sectional view of the piezoelectric driving type MEMS apparatus taken along line A-A shown in FIG. 5.

The MEMS apparatus according to the embodiment is an MEMS switch, which has such a constitution that a supporting portion 6 is provided at one end of a silicon substrate 2, a pair of lower electrodes 37 and leading electrodes 38 are provided at the other end thereof, and a cantilever beam 30 is fixed on the supporting portion 6. The cantilever beam 30 is provided with an insulating film 31, a first electrode 32 provided on the insulating film 31, a piezoelectric film 33 provided on the first electrode 32, a second electrode 34 provided on the piezoelectric film 33, a protective film 35 provided on the second electrode 34, and an upper electrode 36 provided on a face of the insulating film 31 which is opposed from the first electrode. A slit 20 is formed at a central portion of the cantilever beam 30 so as to extend along a longitudinal direction thereof.

A height of the supporting portion 6 is set to be larger than a film thickness of the lower electrode 37, so that a clearance 7 is formed between the lower electrode 37 and the upper electrode 36.

In the embodiment, when a voltage V1 and a voltage V2 (<V1) are respectively applied to the first electrode 32 and the second electrode 34, the piezoelectric film 33 strains in the longitudinal direction of the cantilever beam 30, the cantilever beam 30 flexes toward the substrate 2 due to the strain, and the upper electrode 36 comes in contact with the lower electrodes 37, so that the switch turns on.

According to the embodiment, since the slit 20 is formed in the cantilever beam 30, flexing in a widthwise direction of the beam 30 is reduced, so that when the switch is turned on, the upper electrode 36 comes in surface-contact with the lower electrodes 37 without substantially deforming in the widthwise direction of the beam 30. Therefore, insertion loss can be reduced, as compared with a case that an upper electrode and a lower electrode come in point-contact with each other. Since the total sum of the width of the beam 30 is large, sufficient acceleration tolerance can be achieved. Thereby, a high frequency switch with reduced insertion loss and high acceleration tolerance can be realized.

Third Embodiment

Figure 7:
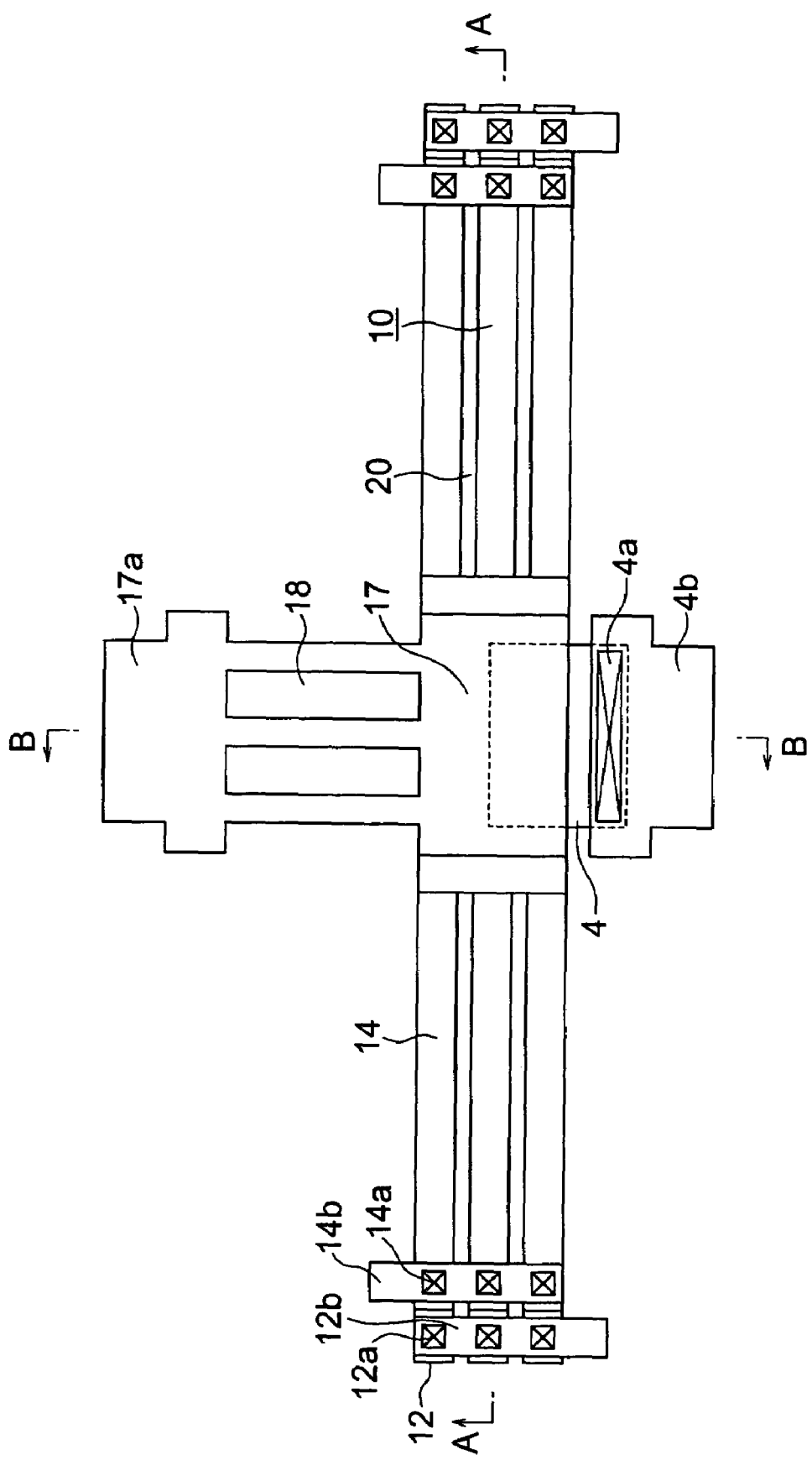
FIG. 7 is a plan view showing a piezoelectric driving type MEMS apparatus according to a third embodiment of the present invention.
Figure 8:
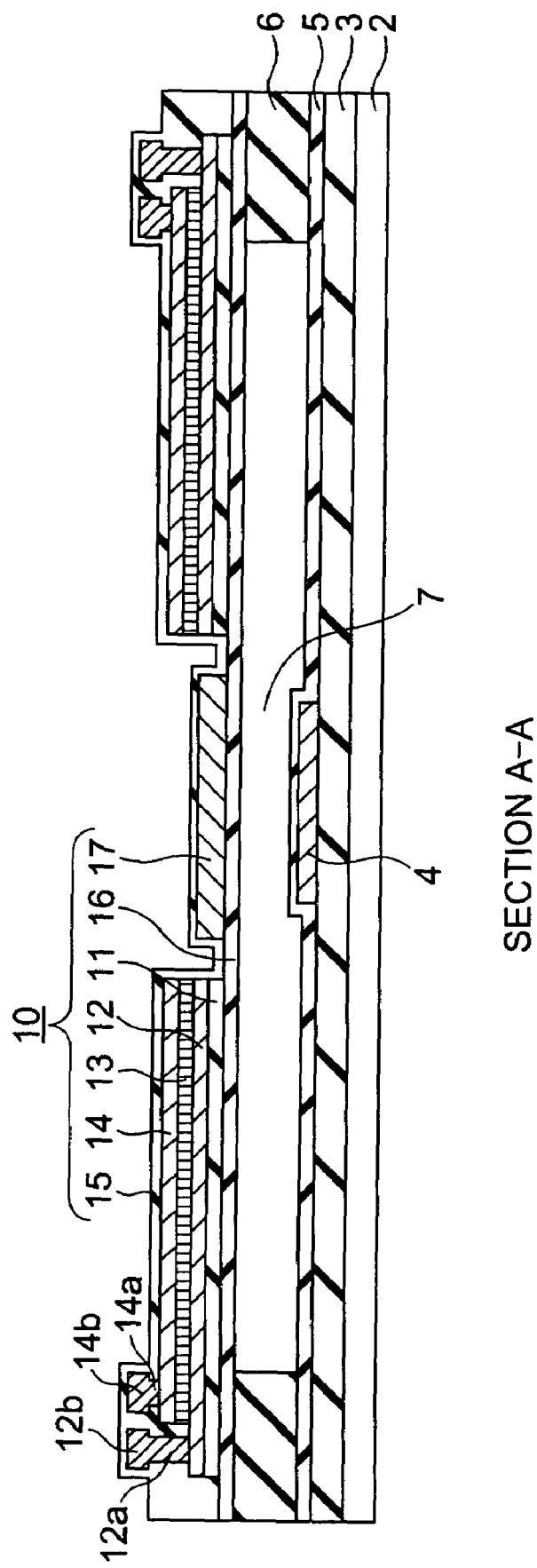
FIG. 8 is a sectional view showing the piezoelectric driving type MEMS apparatus taken along line A-A shown in FIG. 7.
Figure 9:
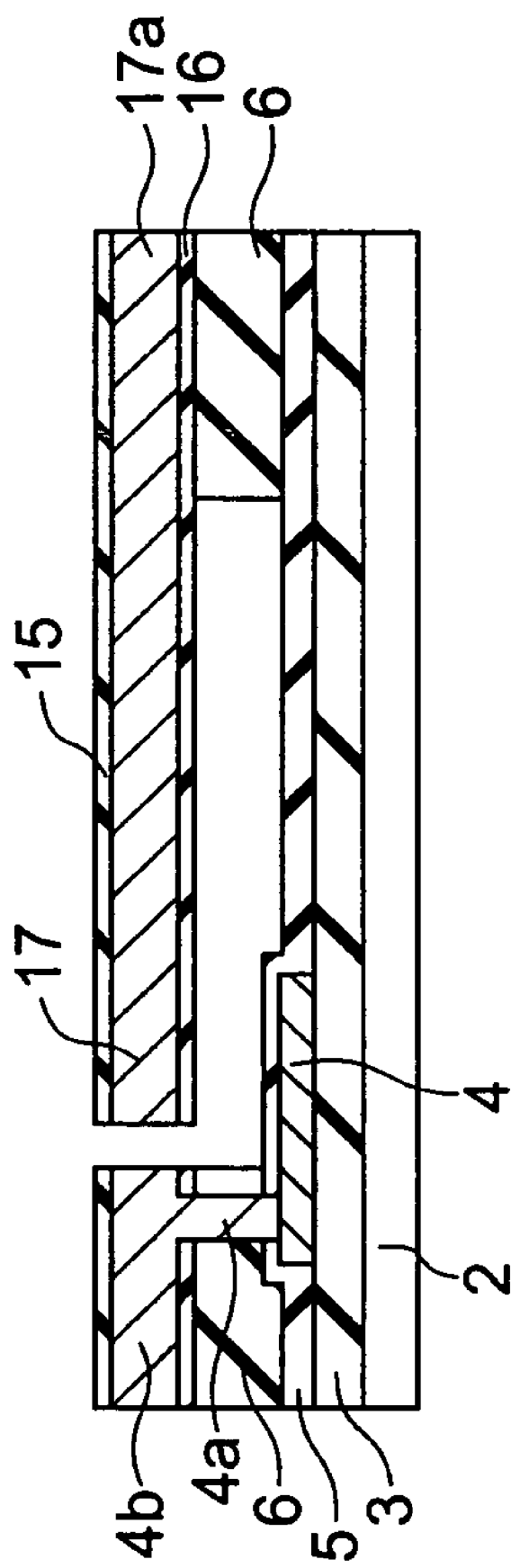
FIG. 9 is a sectional view showing the piezoelectric driving type MEMS apparatus taken along line B-B shown in FIG. 7.

Next, a piezoelectric driving type MEMS apparatus according to a third embodiment of the invention will be explained with reference to FIGS. 7 to 9. FIG. 7 is a plan view of the piezoelectric driving type MEMS apparatus according to the embodiment, FIG. 8 is a sectional view of the piezoelectric driving type MEMS apparatus taken along line A-A shown in FIG. 7, and FIG. 9 is a sectional view of the piezoelectric driving type MEMS apparatus taken along line B-B shown in FIG. 7. Incidentally, FIG. 7 is a plan view where a protective film described later has been removed.

The piezoelectric driving type MEMS apparatus according to the embodiment is a T-shaped type unimorph variable capacitor, which is provided with a lower electrode 4 and a beam 10. The lower electrode 4 is provided at a central portion of a substrate 2 made from silicon and formed thereon with an insulating layer 3 made from, for example, SiO$_2$, and an insulating layer 5 made from, for example, SiN is formed on the lower electrode 4. A plurality of supporting portions 6 are provided on both ends of the substrate 2. The beam 10 is arranged so as to be spanned between the supporting portions 6 on the both ends of the substrate over the lower electrode 4.

The beam 10 is provided with an insulating film 16 made from, for example, SiO$_2$, an upper electrode 17 provided at a central portion of the insulating film 16, an insulating film 11 made from, for example, SiO$_2$ and provided on a region of the insulating film 16 except for the central portion thereof, a first electrode 12 provided on the insulating film 11, piezoelectric films 13 provided on the first electrodes 12, second electrodes 14 provided on the piezoelectric films 13, and a protective film 15 made from, for example, SiO$_2$. Two slits 20a are provided on each of both end portions of the beam 10 so as to extend along a longitudinal direction of the beam 10, so that the beam is formed at each end portion with three branched beams by the slits 20. The three branched beams are respectively supported by the supporting portions 6 (see FIG. 8).

The upper electrode 17 is electrically connected to a leading electrode 17a extending in a direction orthogonal to the longitudinal direction of the beam 10. The leading electrode 17a is provided with a plurality of slits 18 such that its rigidity is reduced and the beam 10 is flexed easily. The leading electrode 17a is supported by a supporting portion 6 (see FIG. 9). Incidentally, such a constitution is employed that a height of the supporting portion 6 is larger than a film thickness of the lower electrode 4, so that a clearance 7 is formed between the lower electrode 4 and the beam 10 (see FIG. 8).

The first electrode 12 is electrically connected to a wire 12b for applying a voltage to the first electrode 12 via a contact 12a, and the second electrode 14 is electrically connected to a wire 14b for applying a voltage to the second electrode 14 via a contact 14a (see FIG. 7). The lower electrode 4 is also electrically connected to a leading electrode 4b for applying a voltage to the lower electrode 4 via a contact 4a (see FIG. 9). The leading electrode 4b is also supported by a supporting portion 6, as shown in FIG. 9.

In the embodiment, when a driving voltage V1 and a driving voltage V2 are respectively applied to the first electrode 12 and the second electrode 14, the piezoelectric film 13 strain and a length thereof in its longitudinal direction (the horizontal direction of the beam 10 in FIG. 7) changes so that the beam 10 flexes toward the lower electrode 4. As a result, a distance between the lower electrode 4 and the first electrode 12 changes so that a capacitance changes.

In the embodiment, the branched beams are formed by providing the slits 20 on the both end portions of the beam 10 like the first embodiment. Therefore, a section of the beam 10 in a widthwise direction takes an approximately flat shape without being deformed substantially, and the lower electrode 4 and the upper electrode 12 constituting the capacitance become substantially parallel to each other, so that a desired capacitance can be obtained like the first embodiment. When the total sum of the widths of the branched beams is set to be equal to the width of the beam where the slits 20 are not provided, acceleration tolerance can be prevented from deteriorating.

As explained above, according to the embodiment, a desired capacitance can be obtained even during application of acceleration.

Fourth Embodiment

Figure 10:
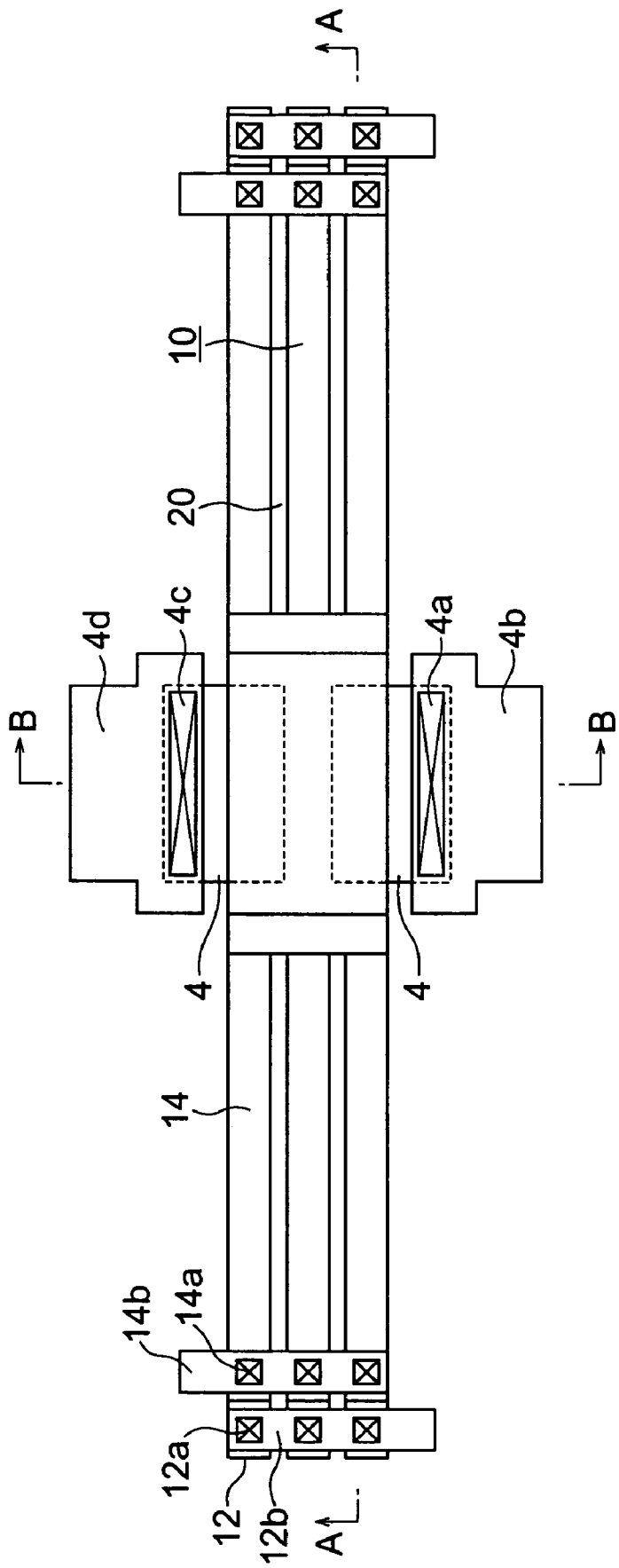
FIG. 10 is a plan view showing a piezoelectric driving type MEMS apparatus according to a fourth embodiment of the present invention.
Figure 11:
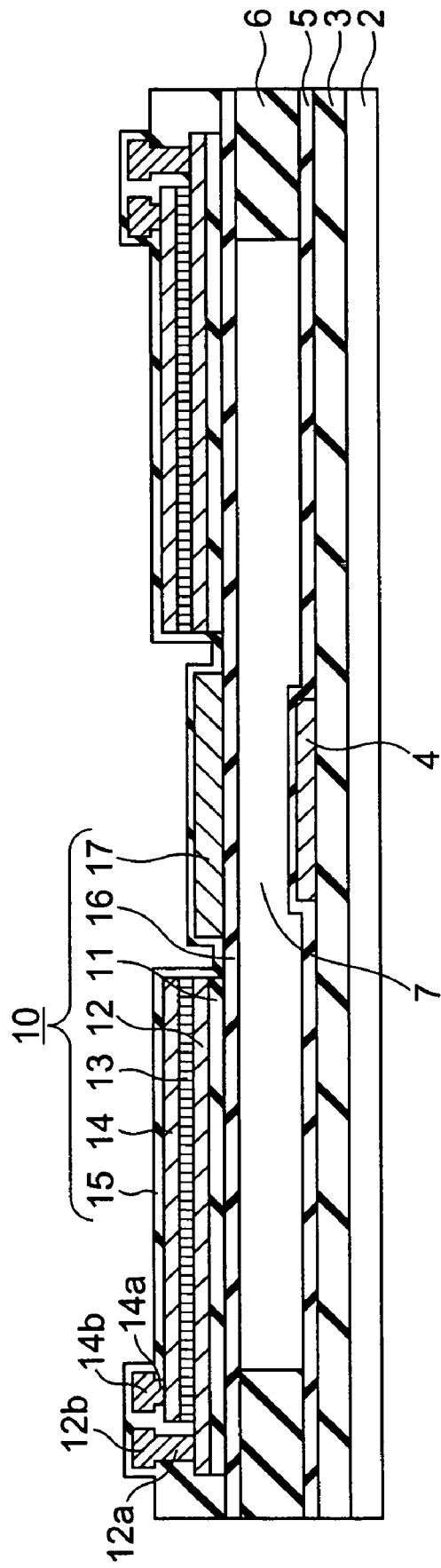
FIG. 11 is a sectional view showing the piezoelectric driving type MEMS apparatus taken along line A-A shown in FIG. 10.
Figure 12:
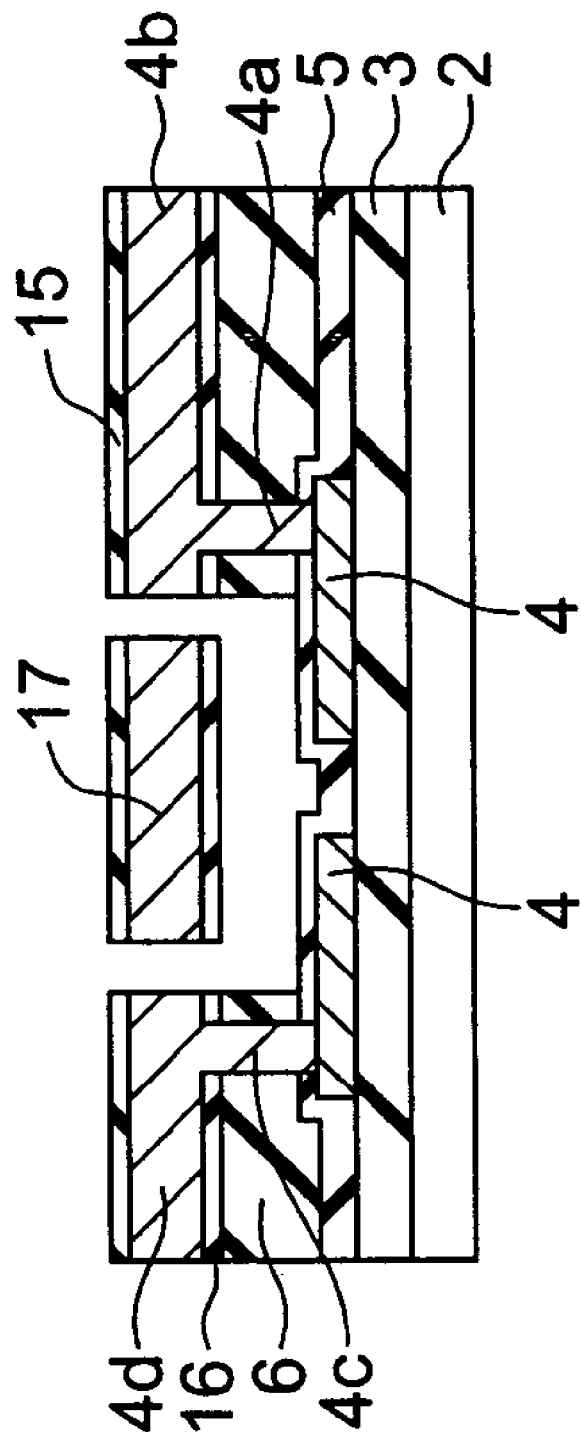
FIG. 12 is a sectional view showing the piezoelectric driving type MEMS apparatus taken along line B-B shown in FIG. 10.

Next, a piezoelectric driving type MEMS apparatus according to a fourth embodiment of the invention will be explained with reference to FIGS. 10 to 12. FIG. 10 is a plan view of the piezoelectric driving type MEMS apparatus according to the embodiment, FIG. 11 is a sectional view of the piezoelectric driving type MEMS apparatus taken along line A-A shown in FIG. 10, and FIG. 12 is a sectional view of the piezoelectric driving type MEMS apparatus taken along line B-B shown in FIG. 10. Incidentally, FIG. 10 is a plan view where a protective film has been removed.

The piezoelectric driving type MEMS apparatus according to the embodiment is an I-shaped type unimorph variable capacitor, which has such a constitution that the upper electrode 17 is put in an electrically floating state by removing the leading electrode 17a for the upper electrode 17 and two lower electrodes 4 are arranged in the T-shaped type unimorph variable capacitor according to the third embodiment shown in FIGS. 7 to 9.

In the embodiment, terminals 4b and 4d are capacitance-coupled via the floating electrode 17. Therefore, a capacitance between the terminals 4b and 4b can be changed by moving the electrode 17 in a vertical direction. In the embodiment, since a leading wire such as the leading wire for the upper electrode 17 in the third embodiment is not provided, the upper electrode is difficult to flex.

In the piezoelectric driving type MEMS apparatus according to the embodiment, since the branched beams are formed by providing slits 20 on the both end portions of the beam 10, a desired capacitance can be obtained even during application of acceleration like the third embodiment.

Fifth Embodiment

Figure 13:
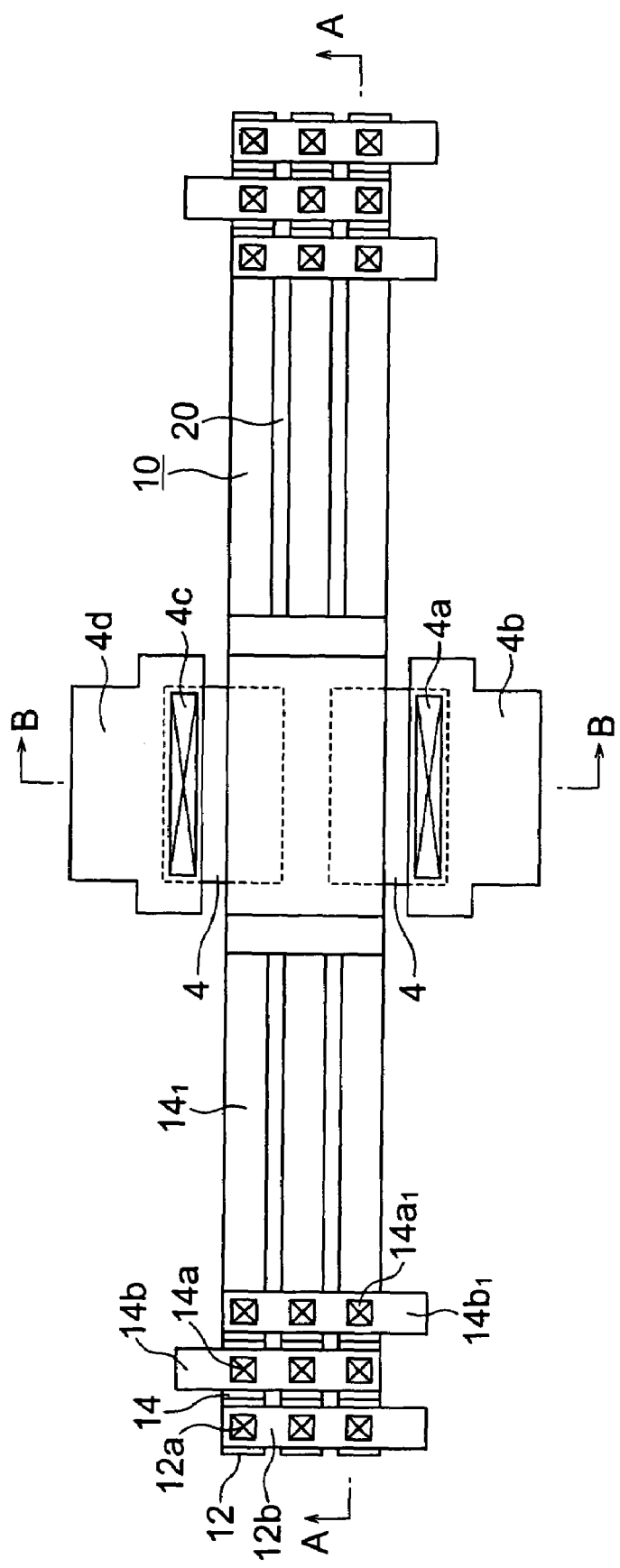
FIG. 13 is a plan view showing a piezoelectric driving type MEMS apparatus according to a fifth embodiment of the present invention.
Figure 14:
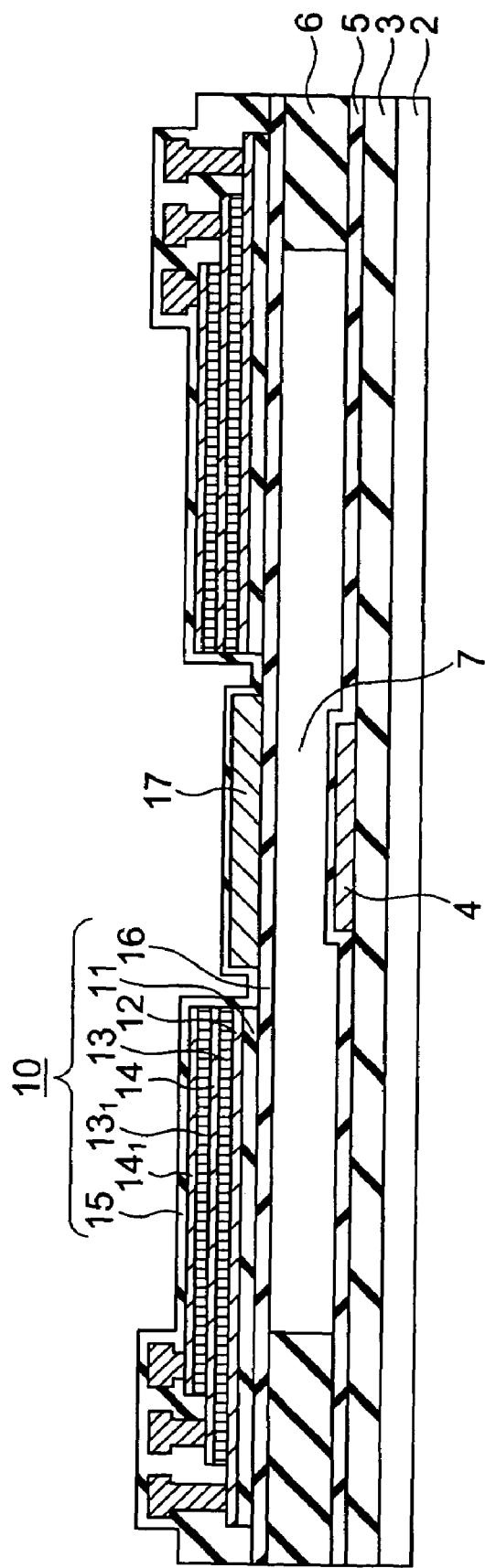
FIG. 14 is a sectional view showing the piezoelectric driving type MEMS apparatus taken along line A-A shown in FIG. 13.
Figure 15:
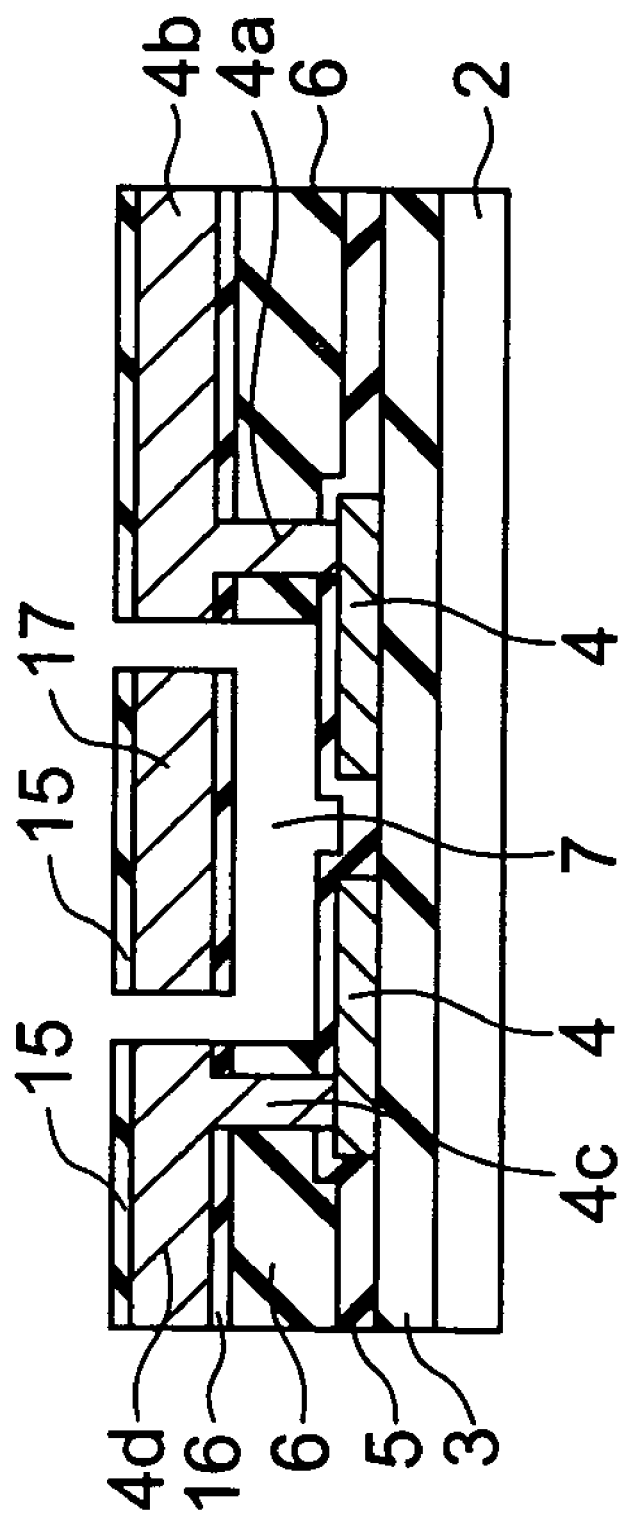
FIG. 15 is a sectional view showing the piezoelectric driving type MEMS apparatus taken along line B-B shown in FIG. 13.

Next, a piezoelectric driving type MEMS apparatus according to a fifth embodiment of the invention will be explained with reference to FIGS. 13 to 15. FIG. 13 is a plan view of the piezoelectric driving type MEMS apparatus according to the embodiment, FIG. 14 is a sectional view of the piezoelectric driving type MEMS apparatus taken along line A-A shown in FIG. 13, and FIG. 15 is a sectional view of the piezoelectric driving type MEMS apparatus taken along line B-B shown in FIG. 13. Incidentally, FIG. 13 is a plan view where a protective film has been removed.

The piezoelectric driving type MEMS apparatus according to the embodiment is an I-shaped type bimorph variable capacitor, which has such a constitution that a piezoelectric film $13_1$ and an electrode $14_1$ are provided on the electrode 14 of the beam 10 in the piezoelectric driving type MEMS apparatus according to the embodiment shown in FIGS. 10 to 12. The electrode $14_1$ is connected to a wire $14b_1$ via a contact $14a_1$.

In the embodiment, according to application of voltages to the electrodes 12, 14, and $14_1$ of the beam 10, the beam 10 flexes, and a distance between the upper electrode 17 and the lower electrode 4 changes, so that a capacitance can be made variable.

In the embodiment, a large capacitance can be obtained and a desired capacitance can be obtained during application of acceleration like the fourth embodiment.

Sixth Embodiment

Figure 16:
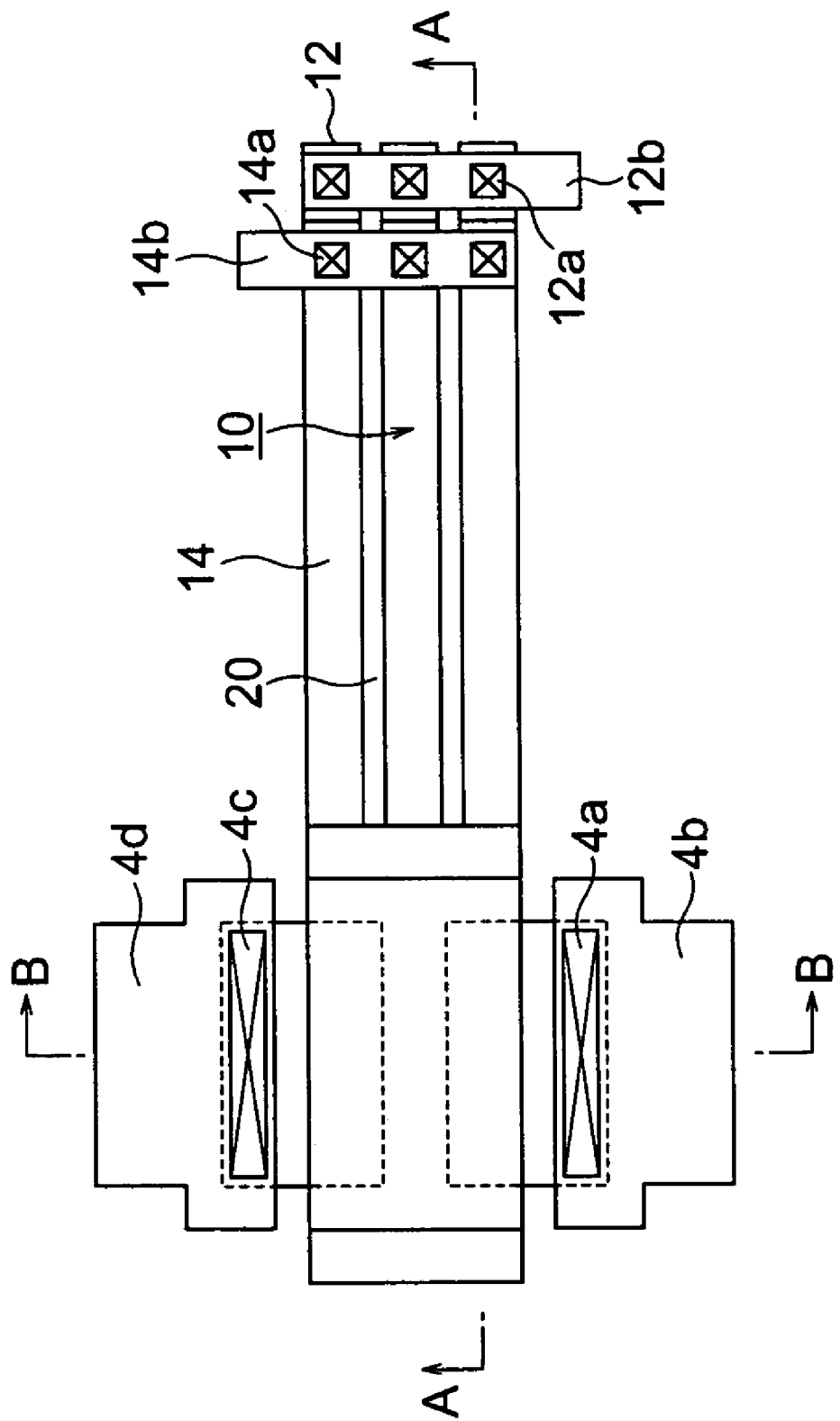
FIG. 16 is a plan view showing a piezoelectric driving type MEMS apparatus according to a sixth embodiment of the present invention.
Figure 17:
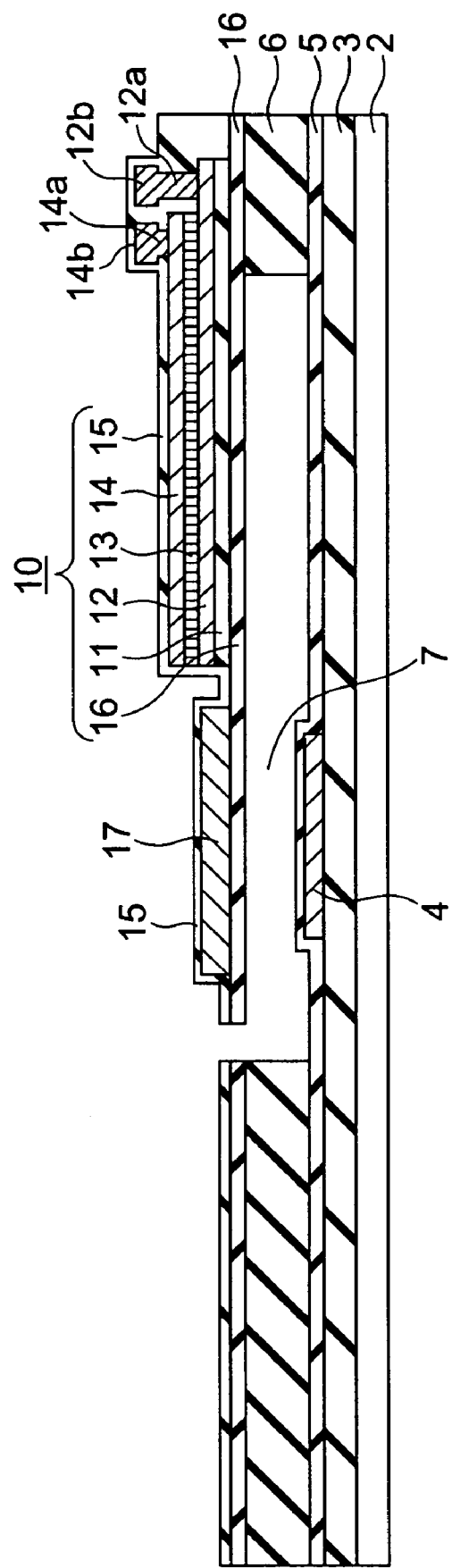
FIG. 17 is a sectional view showing the piezoelectric driving type MEMS apparatus taken along line A-A shown in FIG. 16.
Figure 18:
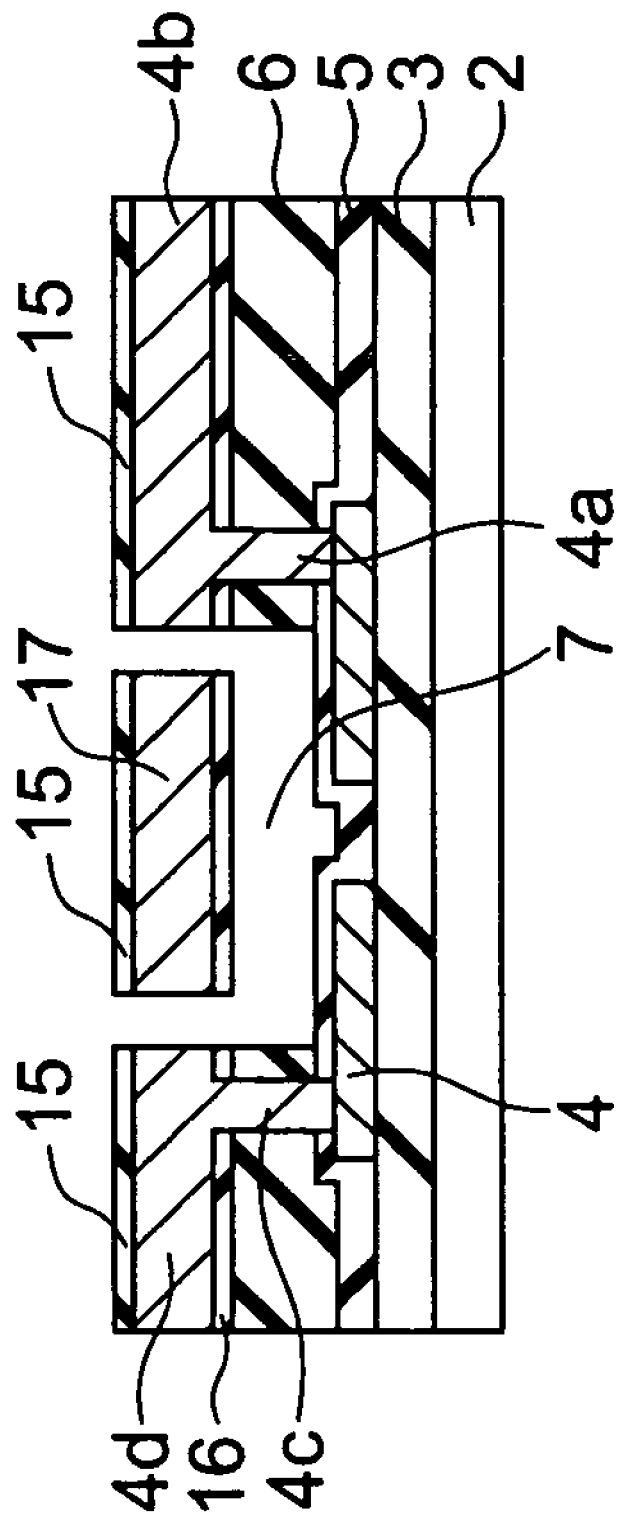
FIG. 18 is a sectional view showing the piezoelectric driving type MEMS apparatus taken along line B-B shown in FIG. 16.

Next, a piezoelectric driving type MEMS apparatus according to a sixth embodiment of the invention will be explained with reference to FIGS. 16 to 18. FIG. 16 is a plan view of the piezoelectric driving type MEMS apparatus according to the embodiment, FIG. 17 is a sectional view of the piezoelectric driving type MEMS apparatus taken along line A-A shown in FIG. 16, and FIG. 18 is a sectional view of the piezoelectric driving type MEMS apparatus taken along line B-B shown in FIG. 16. Incidentally, FIG. 16 is a plan view where a protective film 15 has been removed.

The piezoelectric driving type MEMS apparatus according to the embodiment is an I-shaped type unimorph variable capacitor, which has such a constitution that a beam 10 is constituted as a cantilever beam in the I-shaped unimorph variable capacitor according to the fourth embodiment shown in FIGS. 10 to 12.

In the embodiment, a large capacitance can be obtained and a desired capacitance can be obtained during application of acceleration like the fourth embodiment.

Seventh Embodiment

Figure 19:
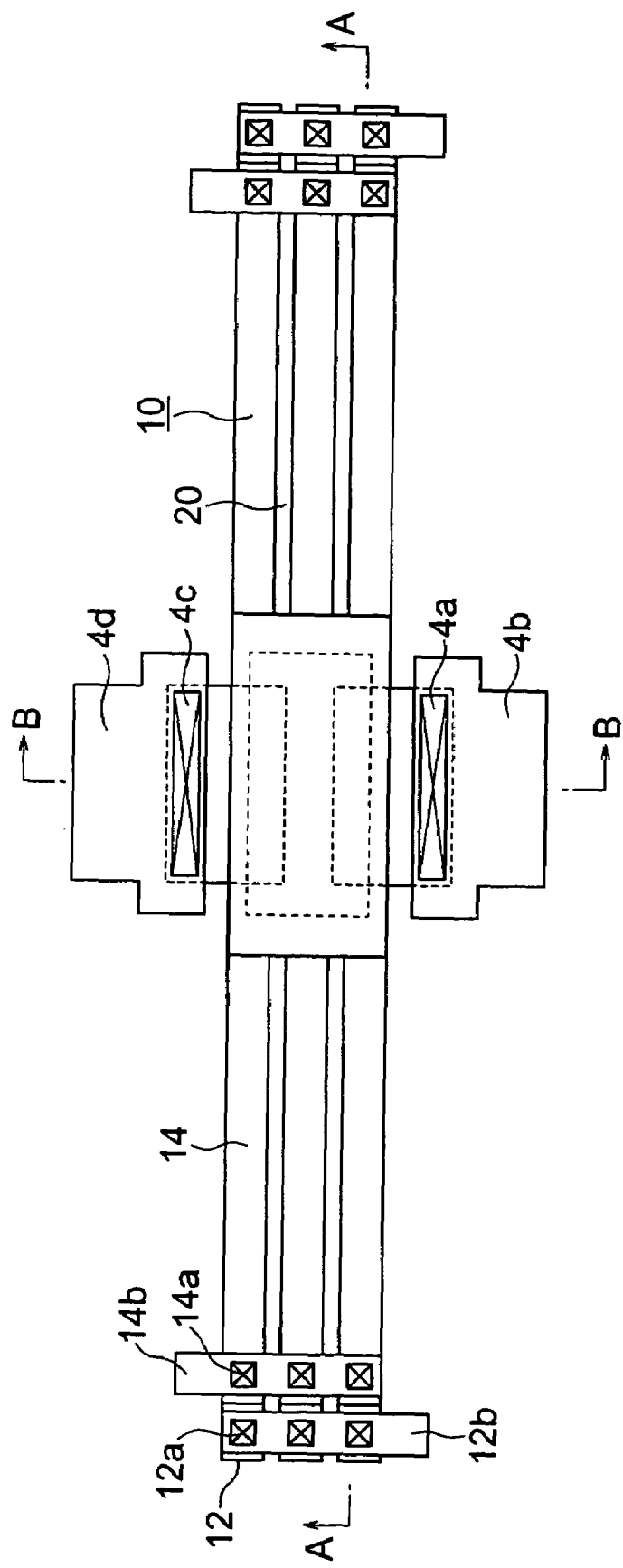
FIG. 19 is a plan view showing a piezoelectric driving type MEMS apparatus according to a seventh embodiment of the present invention.
Figure 20:
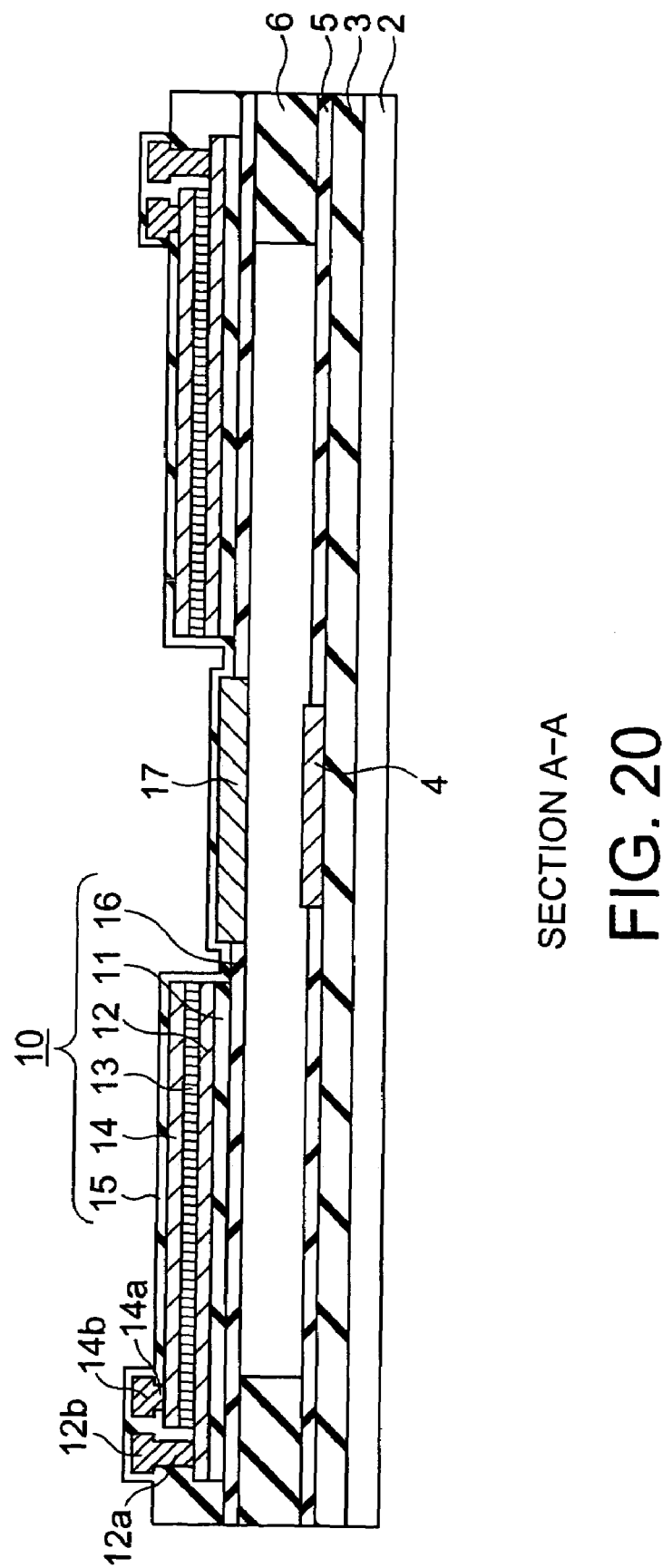
FIG. 20 is a sectional view showing the piezoelectric driving type MEMS apparatus taken along line A-A shown in FIG. 19.
Figure 21:
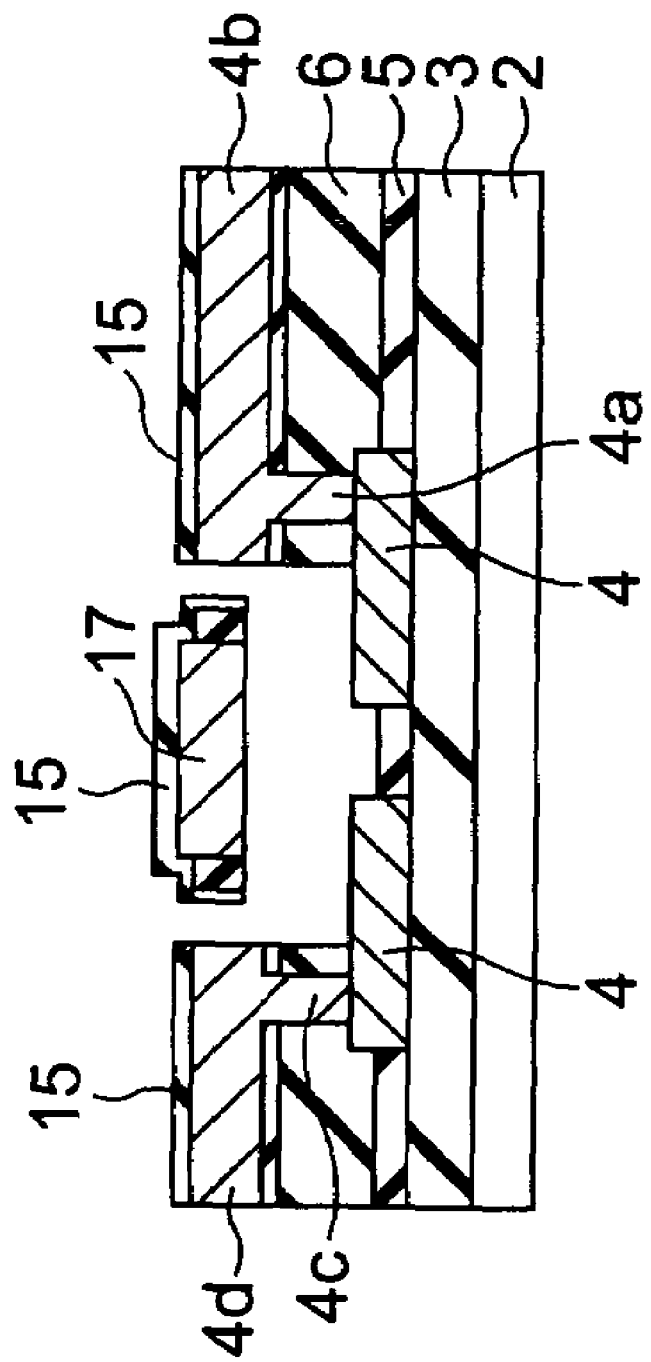
FIG. 21 is a sectional view showing the piezoelectric driving type MEMS apparatus taken along line B-B shown in FIG. 19.

Next, a piezoelectric driving type MEMS apparatus according to a seventh embodiment of the invention will be explained with reference to FIGS. 19 to 21. FIG. 19 is a plan view of the piezoelectric driving type MEMS apparatus according to the embodiment, FIG. 20 is a sectional view of the piezoelectric driving type MEMS apparatus taken along line A-A shown in FIG. 19, and FIG. 21 is a sectional view of the piezoelectric driving type MEMS apparatus taken along line B-B shown in FIG. 19. Incidentally, FIG. 19 is a plan view where a protective film 15 has been removed.

The piezoelectric driving type MEMS apparatus according to the embodiment is an I-shaped type unimorph switch, which has such a constitution that a lower face of the insulating film 16 and a lower face of the upper electrode 17 are made flush with each other by removing the insulating layer 5 on the upper face of the lower electrode 4 to expose an upper face of the lower electrode 4 and removing the insulating film 16 on the lower face of the upper electrode 17 in the I-shaped unimorph variable capacitor according to the fourth embodiment shown in FIGS. 10 to 12.

In the embodiment, since the slits 20 are formed in the beam 10, flexing in a widthwise direction of the beam 10 is reduced, so that when the switch is turned on, the upper electrode 17 comes in surface-contact with the lower electrodes 4 without substantially deforming in the widthwise direction of the beam 10. Therefore, insertion loss can be reduced, as compared with a case that an upper electrode and a lower electrode come in point-contact with each other. Since the total sum of the widths of the beam 10 is large, sufficient acceleration tolerance can be achieved. Thereby, a high frequency switch with reduced insertion loss and high acceleration tolerance can be realized.

Eighth Embodiment

Figure 22:
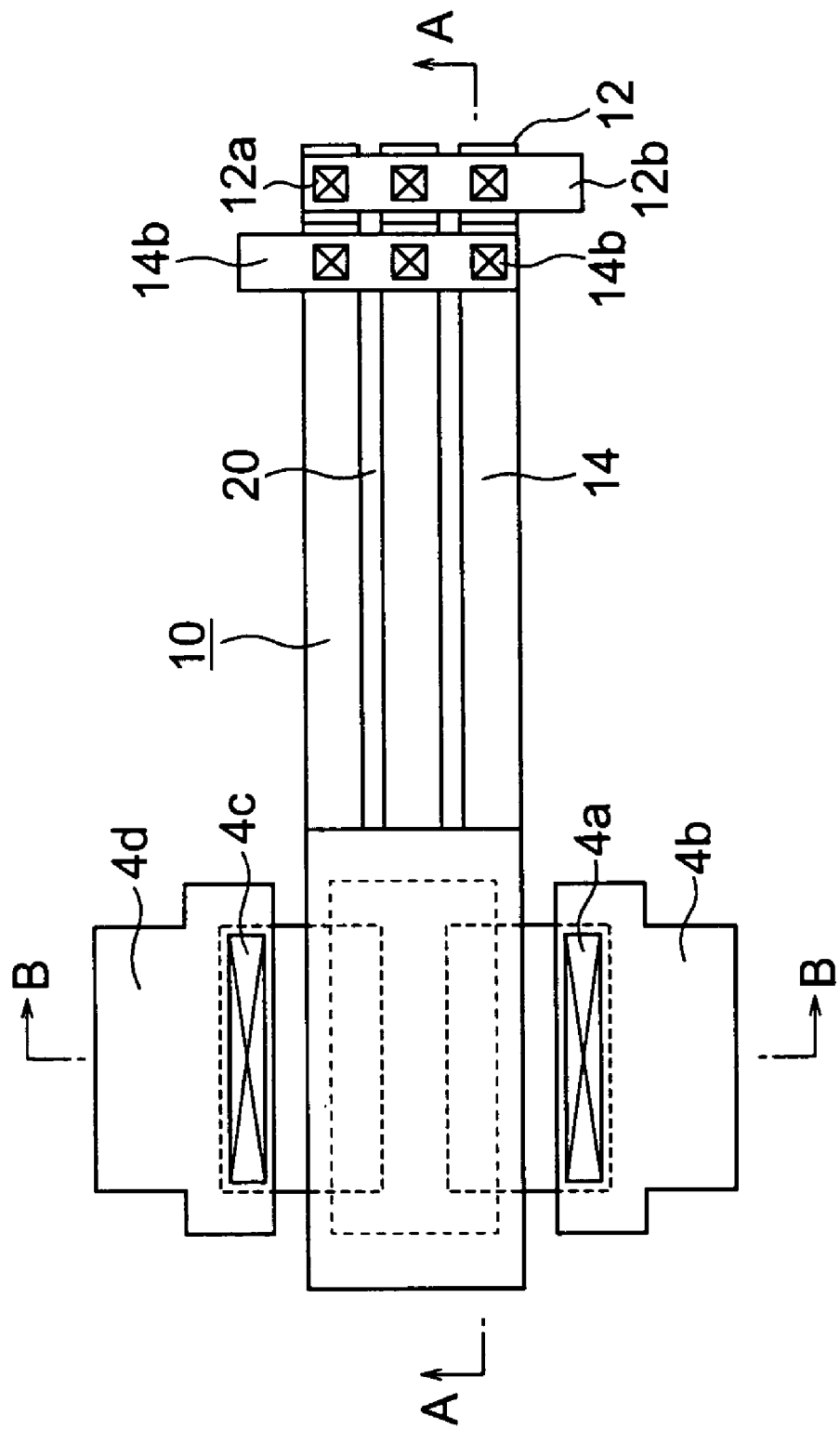
FIG. 22 is a plan view showing a piezoelectric driving type MEMS apparatus according to a eighth embodiment of the present invention.
Figure 23:
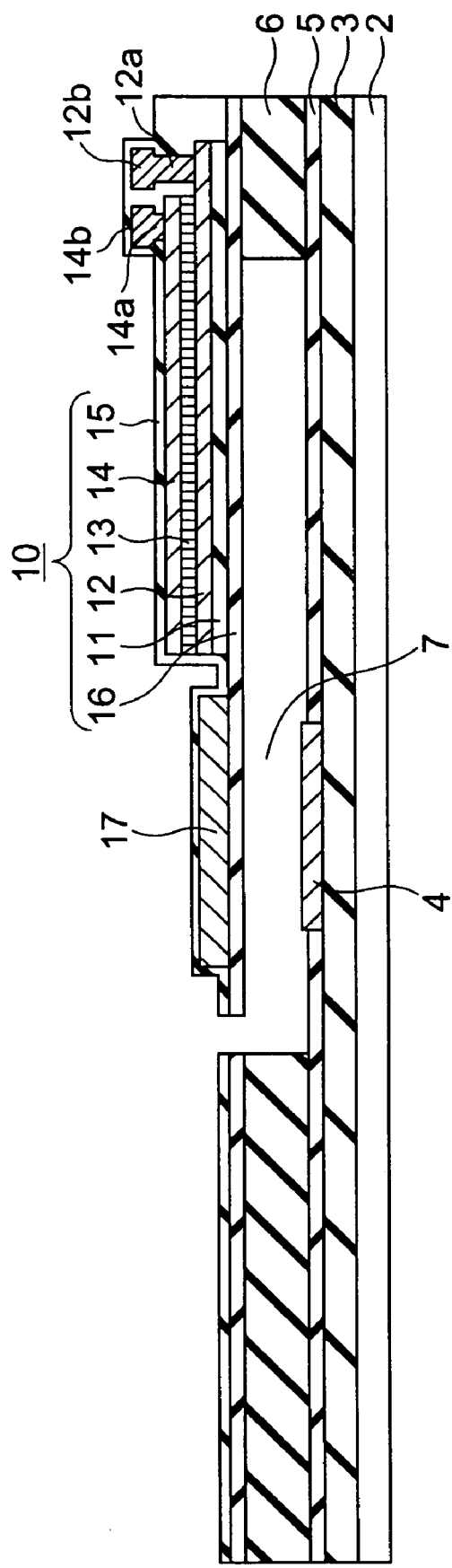
FIG. 23 is a sectional view showing the piezoelectric driving type MEMS apparatus taken along line A-A shown in FIG. 22.
Figure 24:
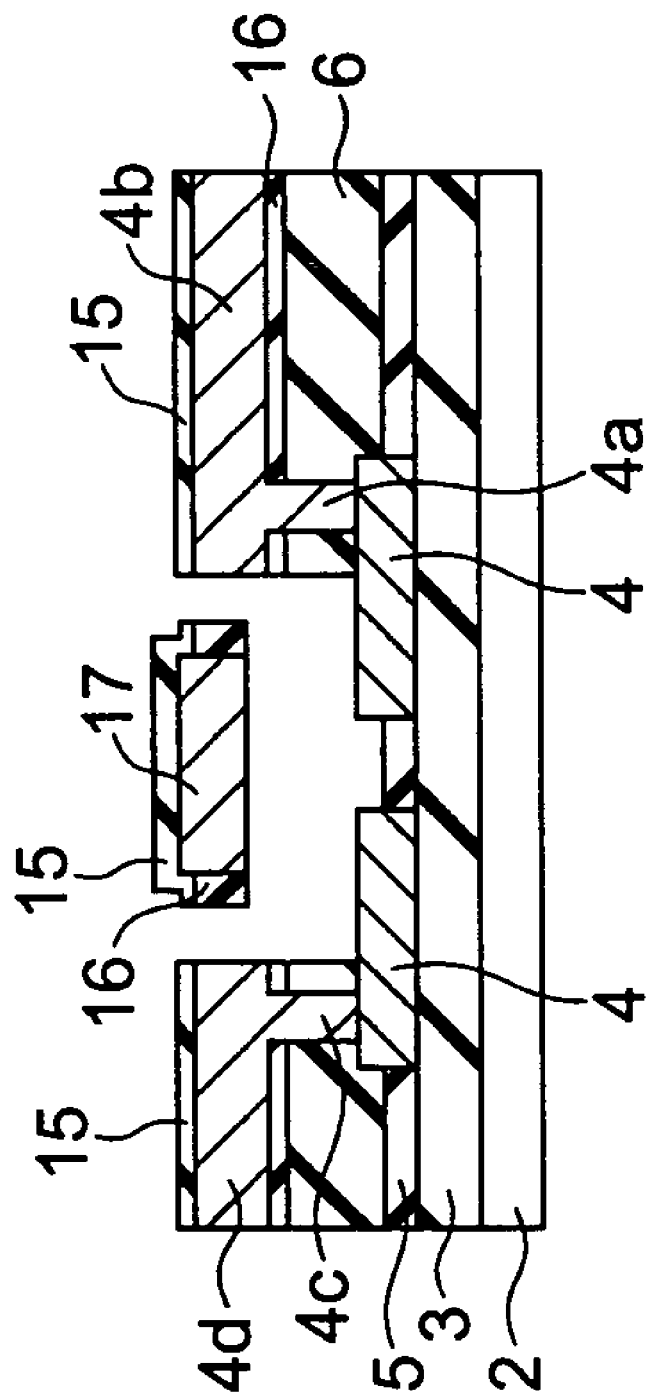
FIG. 24 is a sectional view showing the piezoelectric driving type MEMS apparatus taken along line B-B shown in FIG. 22.

Next, a piezoelectric driving type MEMS apparatus according to an eighth embodiment of the invention will be explained with reference to FIGS. 22 to 24. FIG. 22 is a plan view of the piezoelectric driving type MEMS apparatus according to the embodiment, FIG. 23 is a sectional view of the piezoelectric driving type MEMS apparatus taken along line A-A shown in FIG. 22, and FIG. 24 is a sectional view of the piezoelectric driving type MEMS apparatus taken along line B-B shown in FIG. 22. Incidentally, FIG. 22 is a plan view where a protective film 15 has been removed.

The piezoelectric driving type MEMS apparatus according to the embodiment is an I-shaped type unimorph switch, which has such a constitution that the beam 10 is constituted as a cantilever beam in the I-shaped type unimorph switch according to the seventh embodiment shown in FIGS. 19 to 21.

In the embodiment, since the slits 20 are formed in the beam 10 like the seventh embodiment, flexing in a widthwise direction of the beam 10 is reduced, so that when the switch is turned on, the upper electrode 17 comes in surface-contact with the lower electrodes 4 without substantially deforming in the widthwise direction of the beam 10. Therefore, insertion loss can be reduced, as compared with the case that upper electrode and the lower electrode come in point-contact with each other. Since the total sum of the widths of the beam 10 is large, sufficient acceleration tolerance can be achieved.

Figure 25:
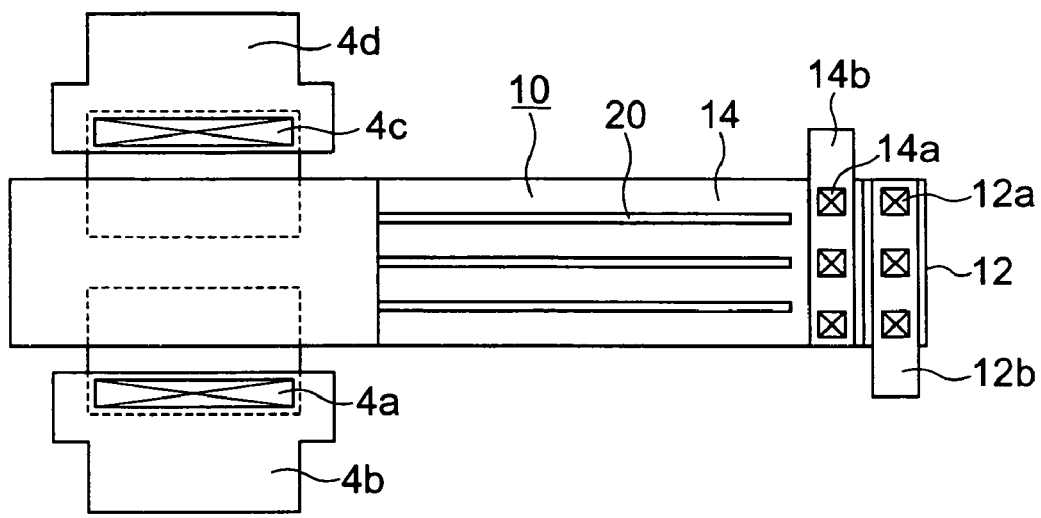
FIG. 25 is a plan view showing a piezoelectric driving type MEMS apparatus according to a first modification of the eighth embodiment of the present invention.

In the eighth embodiment, two slits 20 are provided in the beam 10 for each side thereof. Three or more slits may be formed in the beam, as shown in FIG. 25. Such the number of slits can be applied to not only the eighth embodiment but also the first to seventh embodiments.

Figure 26:
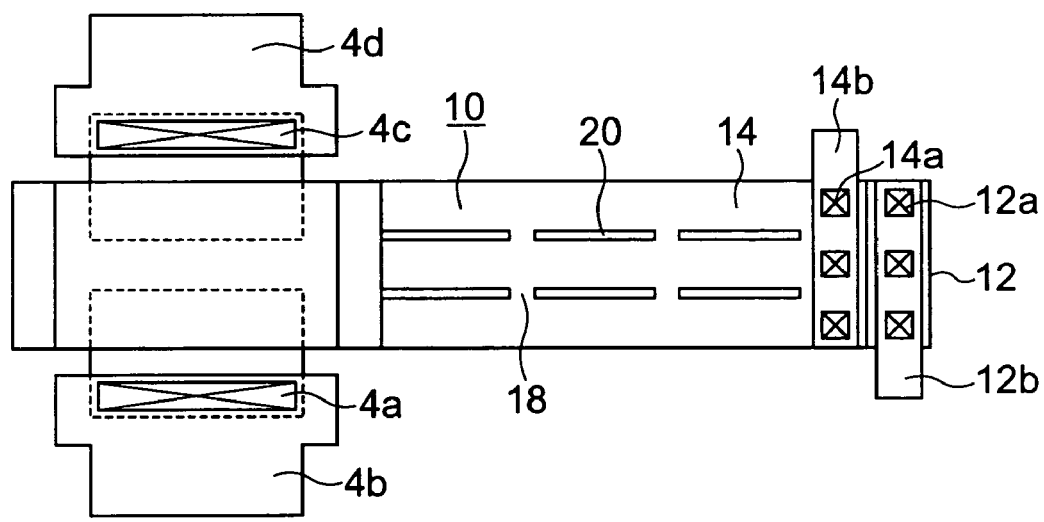
FIG. 26 is a plan view showing a piezoelectric driving type MEMS apparatus according to a second modification of the eighth embodiment of the present invention.
Figure 27:
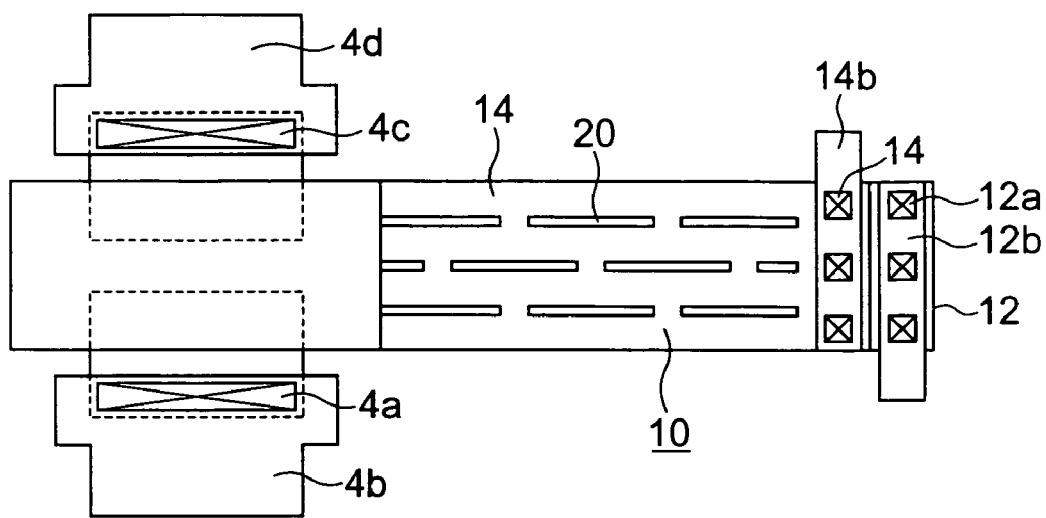
FIG. 27 is a plan view showing a piezoelectric driving type MEMS apparatus according to a third modification of the eighth embodiment of the present invention.

As shown in FIG. 26, the slits 20 may be formed in such a manner that adjacent branched beams are connected to each other by a bridge portion(s) 18. As shown in FIG. 27, the slits 20 may be formed in a mesh manner. These shapes of the slits can be applied to not only the eighth embodiment but also the first to seventh embodiments.

Figure 28:
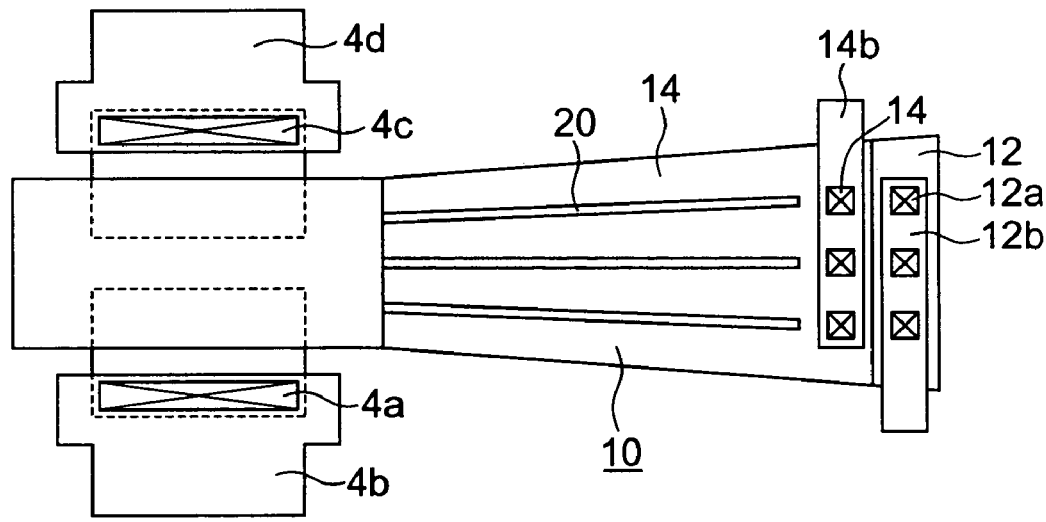
FIG. 28 is a plan view showing a piezoelectric driving type MEMS apparatus according to a fourth modification of the eighth embodiment of the present invention.

As shown in FIG. 28, the beam 10 may be formed in a spreading shape toward the end portion thereof. Such a shape can be applied to not only the eighth embodiment but also the first to seventh embodiments.

Ninth Embodiment

Figure 29:
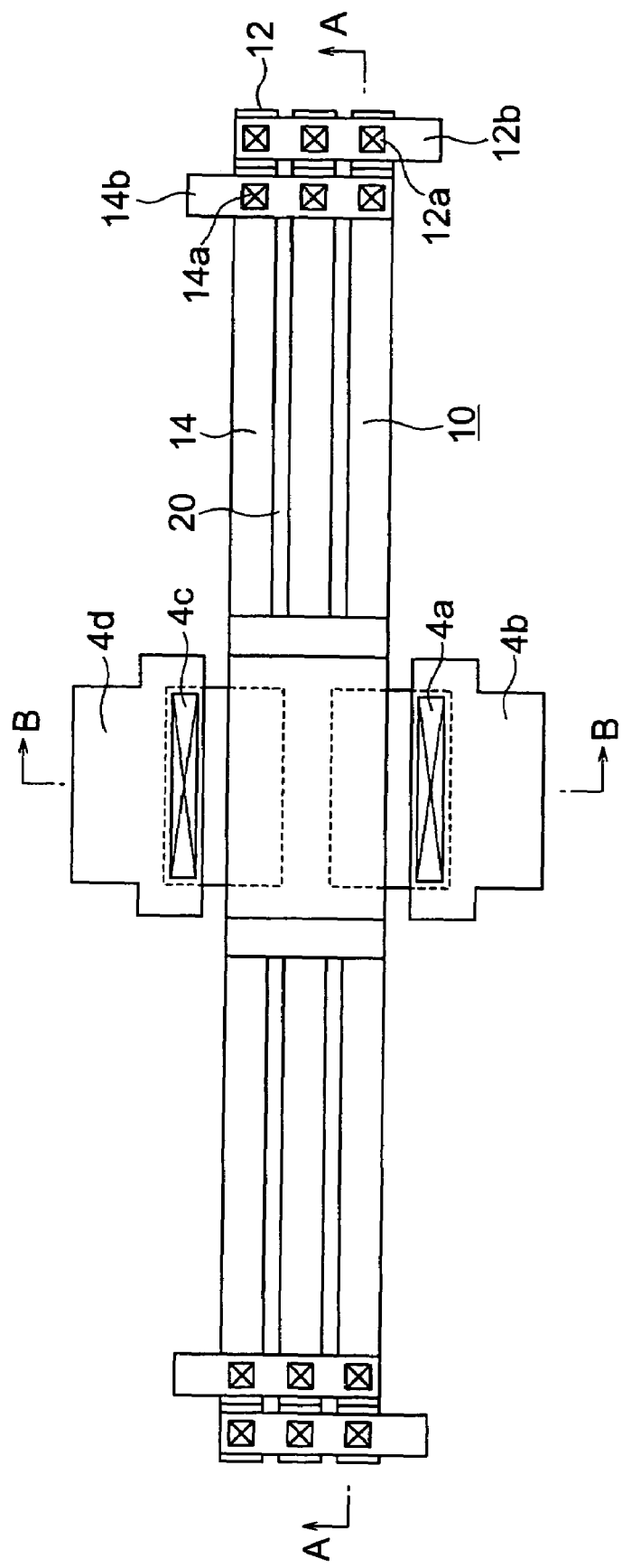
FIG. 29 is a plan view showing a piezoelectric driving type MEMS apparatus according to a ninth embodiment of the present invention.
Figure 30:
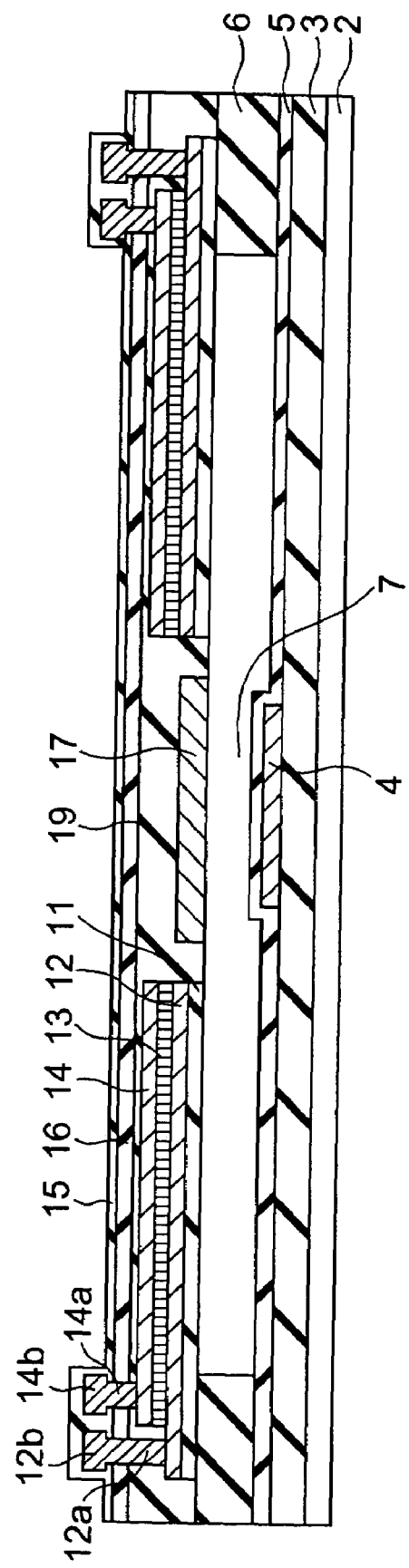
FIG. 30 is a sectional view showing the piezoelectric driving type MEMS apparatus taken along line A-A shown in FIG. 29.
Figure 31:
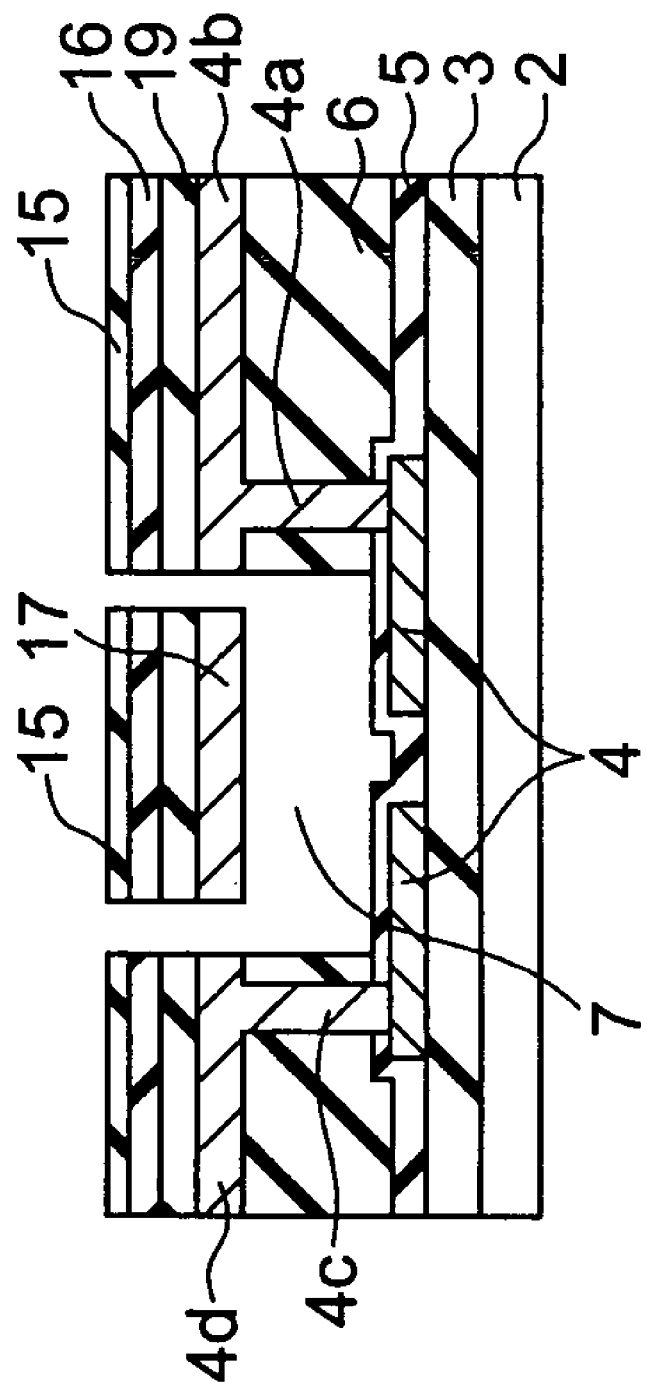
FIG. 31 is a sectional view showing the piezoelectric driving type MEMS apparatus taken along line B-B shown in FIG. 29.

Next, a piezoelectric driving type MEMS apparatus according to a ninth embodiment of the invention will be explained with reference to FIGS. 29 to 31. FIG. 29 is a plan view of the piezoelectric driving type MEMS apparatus according to the embodiment, FIG. 30 is a sectional view of the piezoelectric driving type MEMS apparatus taken along line A-A shown in FIG. 29, and FIG. 31 is a sectional view of the piezoelectric driving type MEMS apparatus taken along line B-B shown in FIG. 29. Incidentally, FIG. 29 is a plan view where a protective film 15 has been removed.

The piezoelectric driving type MEMS apparatus according to the embodiment is an I-shaped type unimorph variable capacitor, which has such a constitution that the supporting layer or portion 16 for the upper electrode 17 is provided above the upper electrode 17 of the beam 10 in the I-shaped type unimorph variable capacitor according to the fourth embodiment shown in FIGS. 10 to 12. Such a constitution is employed that the supporting portion 16 for the upper electrode 17 is provided above the upper electrode 17 and the electrode 14 via an interlayer insulating film 19.

In the embodiment, a large capacitance can be obtained and a desired capacitance can be obtained during application of acceleration like the fourth embodiment.

In the above embodiments, the MEMS variable capacitors or the MEMS switches have been explained, but the structure of a beam having a piezoelectric actuator, namely a piezoelectric film can be applied to devices except for these capacitors and the switches.

As explained above, according to the respective embodiments of the invention, a piezoelectric driving type MEMS apparatus which can obtain desired characteristics even during application of acceleration can be provided.

What is claimed is:

1. A piezoelectric driving type MEMS apparatus comprising:
   a supporting portion provided on a substrate;
   a piezoelectric actuator, which is supported on the supporting portion, including a piezoelectric film and a driving electrode configured to drive the piezoelectric film, the piezoelectric film in the piezoelectric actuator having at least one slit extending along a longitudinal direction of the piezoelectric actuator,
   wherein the piezoelectric actuator further comprises an insulating film supported by the supporting portion in a cantilever and a first electrode provided on an end portion of the insulating film which is opposed from the supporting portion, the driving electrode has a first driving electrode and a second driving electrode, the first driving electrode is provided on the insulating film so as to be electrically separated from the first electrode, the piezoelectric film is provided on the first driving electrode, and the second driving electrode is provided on the piezoelectric film; and
   a second electrode is provided on the substrate so as to be opposed to the first electrode,
   wherein the slits are plural, and the respective slits penetrate the insulating film, the first driving electrode, the piezoelectric film and the second driving electrode.

2. A piezoelectric driving type MEMS apparatus according to claim 1, wherein the piezoelectric driving type MEMS apparatus is a variable capacitor or a switch.

3. A piezoelectric driving type MEMS apparatus according to claim 1, wherein the slits are provided in a mesh.

4. A piezoelectric driving type MEMS apparatus according to claim 1, wherein the driving electrode includes a first driving electrode to a third driving electrode, the piezoelectric film includes a first piezoelectric film and a second piezoelectric film, the first piezoelectric film is provided on the first driving electrode, the second driving electrode is provided on the first piezoelectric film, the second piezoelectric film is provided on the second driving electrode, and the third driving electrode is provided on the second piezoelectric film.

5. A piezoelectric driving type MEMS apparatus according to claim 4, wherein the slits are plural, and the respective slits penetrates the insulating film, the first driving electrode, the first piezoelectric film, the second driving electrode, the second piezoelectric film and the third driving electrode.

6. A piezoelectric driving type MEMS apparatus comprising:
   a supporting portion provided on a substrate;
   a piezoelectric actuator, which is supported on the supporting portion, including a piezoelectric film and a driving electrode configured to drive the piezoelectric film, the piezoelectric film in the piezoelectric actuator having at least one slit extending along a longitudinal direction of the piezoelectric actuator,
   wherein the piezoelectric actuator further comprises an insulating film supported by the supporting portion in a both end supporting and a first electrode provided at a central portion of the insulating film, the driving electrode has a first driving electrode and a second driving electrode, the first driving electrode is provided on each of both end portions of the insulating film so as to be electrically separated from the first electrode, the piezoelectric film is provided on the first driving electrode, and the second driving electrode is provided on the piezoelectric film; and
   a second electrode is provided on the substrate so as to be opposed to the first electrode,
   wherein the slits are plural, and the respective slits penetrate the insulating film, the first driving electrode, the piezoelectric film and the second driving electrode.

7. A piezoelectric driving type MEMS apparatus according to claim 6, wherein the piezoelectric driving type MEMS apparatus is a variable capacitor or a switch.

8. A piezoelectric driving type MEMS apparatus according to claim 1, further comprising:
   a leading electrode provided with a connecting portion connecting to the first electrode,
   wherein one end of the leading electrode is supported by a second supporting portion provided on the substrate, and the connecting portion are provided with a plurality of slits.

9. A piezoelectric driving type MEMS apparatus according to claim 8, wherein the slits are provided in a mesh.

10. A piezoelectric driving type MEMS apparatus according to claim 6, wherein the driving electrode has a first driving electrode to a third driving electrode, the piezoelectric film has a first piezoelectric film and a second piezoelectric film, the first piezoelectric film is provided on the first driving electrode, the second driving electrode is provided on the first piezoelectric film, the second piezoelectric film is provided on the second driving electrode, and the third driving electrode is provided on the second piezoelectric film.

11. A piezoelectric driving type MEMS apparatus according to claim 10, wherein the slits are plural and the respective slits penetrate the insulating film, the first driving electrode, the first piezoelectric film, the second driving electrode, the second piezoelectric film and the third driving electrode.

12. A piezoelectric driving type MEMS apparatus according to claim 11, wherein the piezoelectric driving type MEMS apparatus is a variable capacitor or a switch.

13. A piezoelectric driving type MEMS apparatus, comprising:
   a supporting portion provided on a substrate;
   a piezoelectric actuator, which is supported on the supporting portion, including a piezoelectric film and a driving electrode configured to drive the piezoelectric film, the piezoelectric film in the piezoelectric actuator having at least one slit extending along a longitudinal direction of the piezoelectric actuator,
   wherein a first electrode is provided on the substrate,
   the piezoelectric actuator further comprises an insulating film supported by the supporting portion in a both end supporting and a second electrode provided on a central portion of the insulating film so as to be opposed to the first electrode, and
   the driving electrode comprises a first driving electrode and a second driving electrode, the first driving electrode is provided on each of both end portions on a face of the insulating film which is opposed to the first electrode so as to be electrically separated from the first electrode, the piezoelectric film is provided on the first driving electrode, and the second driving electrode is provided on the piezoelectric film,
   wherein the slits are plural, and the respective slits penetrate the insulating film, the first driving electrode, the piezoelectric film and the second driving electrode.

14. A piezoelectric driving type MEMS apparatus according to claim 13, wherein the piezoelectric driving type MEMS apparatus is a variable capacitor or a switch.

15. A piezoelectric driving type MEMS apparatus according to claim 13, wherein the slits are provided in a mesh.

* * * * *